United States Patent
Kato et al.

(10) Patent No.: US 9,060,145 B2
(45) Date of Patent: Jun. 16, 2015

(54) SOLID-STATE IMAGE TAKING APPARATUS, METHOD FOR DRIVING SOLID-STATE IMAGE TAKING APPARATUS AND ELECTRONIC APPARATUS

(75) Inventors: Akihiko Kato, Tokyo (JP); Tadayuki Taura, Kanagawa (JP); Ikuhiro Yamamura, Kanagawa (JP); Shinichi Yoshimura, Tokyo (JP); Yusuke Oike, Kanagawa (JP)

(73) Assignee: Sony Corporation, Tokyo (JP)

(*) Notice: Subject to any disclaimer, the term of this patent is extended or adjusted under 35 U.S.C. 154(b) by 1151 days.

(21) Appl. No.: 12/929,858

(22) Filed: Feb. 22, 2011

(65) Prior Publication Data
US 2011/0221940 A1    Sep. 15, 2011

(30) Foreign Application Priority Data

Mar. 11, 2010  (JP) .................. 2010-054140

(51) Int. Cl.
*H04N 5/335*    (2011.01)
*H04N 5/3745*   (2011.01)
*H04N 5/378*    (2011.01)

(52) U.S. Cl.
CPC ............. *H04N 5/3745* (2013.01); *H04N 5/378* (2013.01)

(58) Field of Classification Search
CPC .................... H01L 27/14609; H04N 3/155
USPC ........................... 348/250, 308; 250/208.1
See application file for complete search history.

(56) References Cited

U.S. PATENT DOCUMENTS

2001/0013571 A1* 8/2001  Kakumoto et al. ........ 250/208.1
2006/0219868 A1* 10/2006 Morimoto et al. ........ 250/208.1
2009/0251582 A1* 10/2009 Oike ............................ 348/308

FOREIGN PATENT DOCUMENTS

JP    2006-108889       4/2006
JP    2006-311515       11/2006
JP    2007-335978 A     12/2007

* cited by examiner

*Primary Examiner* — Joel Fosselman
(74) *Attorney, Agent, or Firm* — Sony Corporation

(57) ABSTRACT

Disclosed herein is a solid-state image taking apparatus, includes: a pixel array section including unit pixels laid out two-dimensionally to form a matrix to serve as unit pixels each employing an opto-electric conversion device, a transfer transistor, a first electric-charge accumulation section, a read transistor, a second electric-charge accumulation section, a reset transistor, and an amplification transistor; a driving section; and a correction section.

13 Claims, 18 Drawing Sheets

F I G . 2
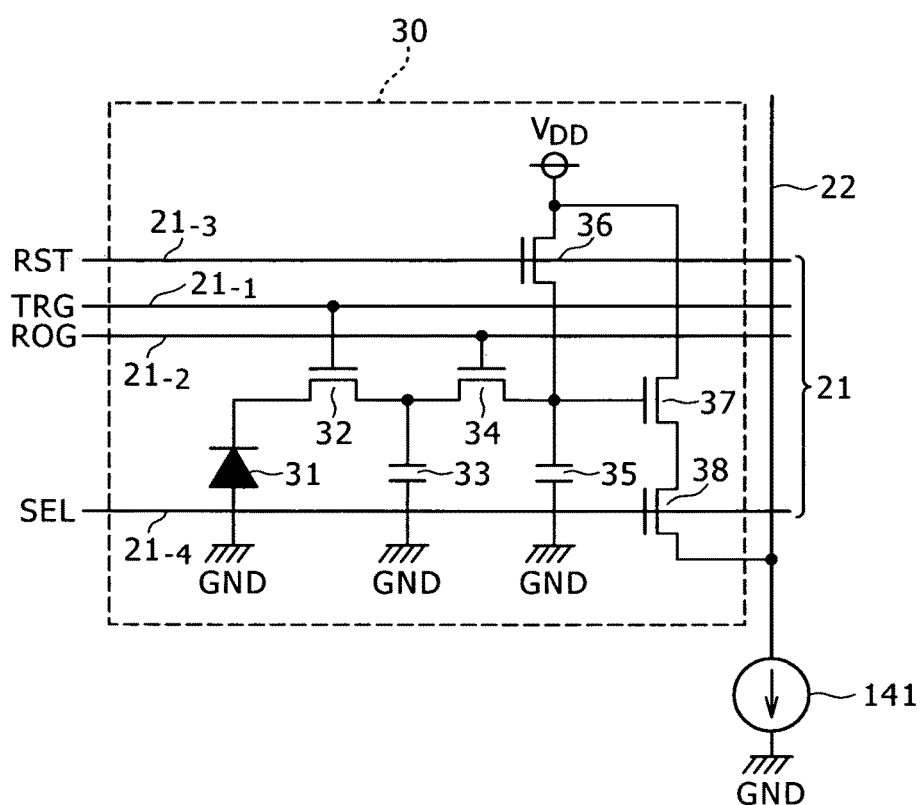

F I G . 3
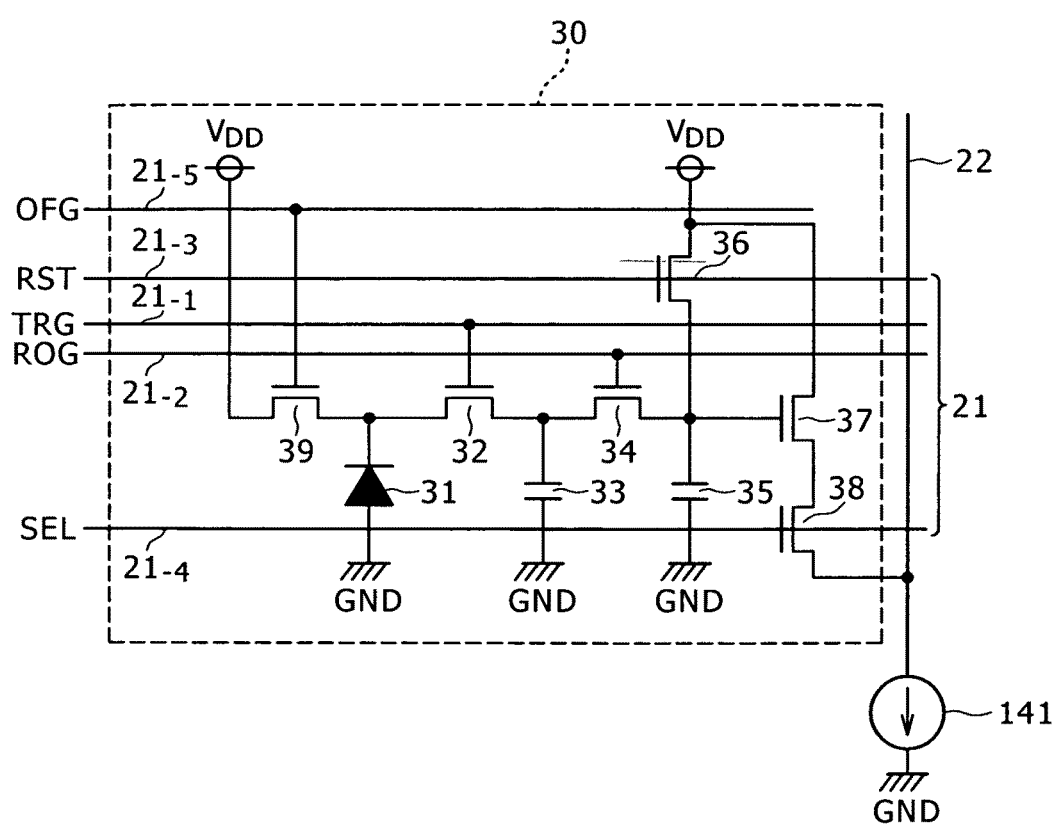

SOLID-STATE IMAGE TAKING APPARATUS, METHOD FOR DRIVING SOLID-STATE IMAGE TAKING APPARATUS AND ELECTRONIC APPARATUS

BACKGROUND OF THE INVENTION

1. Field of the Invention

The present invention relates to a solid-state image taking apparatus, a method for driving the solid-state image taking apparatus and an electronic apparatus employing the solid-state image taking apparatus.

2. Description of the Related Art

A Complementary Metal-Oxide Semiconductor, CMOS-type image sensor is a kind of solid-state image taking apparatus typically adopting the X-Y addressing system. The CMOS-type image sensor employs a pixel array section composed of unit pixels laid out two-dimensionally to form a matrix. In the following description, the unit pixel is also referred to simply as a pixel. Each of the unit pixels includes an opto-electric conversion device. The CMOS-type image sensor has a mechanism for sequentially scanning the pixel array section in pixel-row units and reading out signals generated by the pixels from the pixel array section. In an operation to sequentially scan the pixel array section in pixel-row units, an electronic shutter adopting a rolling shutter method is used. In this case, the length of an accumulation period of the pixel varies from pixel row to pixel row. Thus, in the operation to sequentially scan the pixel array section in pixel-row units, a phenomenon referred to as focal plane distortion occurs. In the focal plane distortion phenomenon, an image which is obtained as a result of an image taking operation carried out on an image taking object is distorted during the image taking operation.

In an application to take an image of an image taking object moving at a high velocity and not allowing a type of image distortion or in a sensing application requiring simultaneity of an image produced by an image taking operation, it is necessary to employ a global exposure mechanism (or a global shutter) for starting and ending an exposure operation with the same timings for all unit pixels in the pixel array section. The global exposure mechanism carries out an all-row simultaneous reset driving operation in order to reset unit pixels of the pixel array section for all pixel rows so that the accumulation operations of all unit pixels in the pixel array section can be started at the same time. Then, an all-row simultaneous electric-charge transfer operation is carried out in order to transfer electric charge to an electric-charge accumulation section such as a floating diffusion area at the same time so that the accumulation operations of all unit pixels in the pixel array section can be ended at the same time. Thus, it is possible to carry out a driving operation that results in simultaneity of accumulation periods of all individual unit pixels employed in the pixel array section. For details, see Japanese Patent Laid-Open No. 2006-311515 (Patent Document 1).

The opto-electric conversion device carries out an opto-electric conversion process to convert incident light into signal electric charge which is then transferred to the electric-charge accumulation section to be stored temporarily in the electric-charge accumulation section. By the way, in a row-after-row scan operation to read out the signal electric charge from the electric-charge accumulation section, the following problem is raised. Before the row-after-row scan operation to read out the signal electric charge from the electric-charge accumulation section, the signal electric charge stored in the electric-charge accumulation section deteriorates due to an aliasing signal. The aliasing signal includes a leak component of the electric charge and a noise component generated in an opto-electric conversion process carried out by the electric-charge accumulation section itself.

The leak component of the electric charge increases proportionally to the length of the elapsed time. In addition, the period ending at the operation to read out signal electric charge from the electric-charge accumulation section varies from row to row. If the driving operation is carried out to perform the operation to read out signal electric charge from the electric-charge accumulation section in a direction from the upper side of an image to the lower side of the image for example, the noise component increases, forming a shading shape in the direction from the upper side of an image to the lower side of the image. On top of that, while an image taking object serving as a noise source is undesirably moving in a period between the end of the electric-charge accumulation operation and the start of the electric-charge read operation, the noise component generated in an opto-electric conversion process carried out by the electric-charge accumulation section itself appears at a position different from the position of an image obtained as a result of the electric-charge accumulation operation. Thus, the image becomes unnatural.

In order to solve the problem described above, there has been proposed an image taking apparatus employing correction pixels separately from image taking pixels. The image taking pixel is a unit pixel used for accumulating and holding electric charge. On the other hand, the correction pixel is a pixel not used for holding accumulated electric charge but used for merely generating only an aliasing signal of an electric-charge holding section. For details, see Japanese Patent Laid-Open No. 2006-108889 (Patent Document 2). To put it concretely, an aliasing signal read out from a correction pixel in the vicinity of an image taking unit pixel is subtracted from a signal read out from the image-taking unit pixel as a signal including an aliasing signal in order to correct the aliasing signal read out from the image taking unit pixel.

SUMMARY OF THE INVENTION

By the way, in order to obtain an excellent image having simultaneity of accumulation periods of all individual unit pixels, it is necessary to correct an aliasing signal generated in a signal, which is held in an electric-charge accumulation section such as a floating diffusion area at the end of an electric-charge accumulation operation, during a period prior to an operation to read out the signal from the electric-charge accumulation section.

In accordance with an existing technology disclosed in Patent Document 2, correction pixels are provided for example alternately with image taking pixels on a matrix row or a matrix column. As described earlier, the image taking pixel is a unit pixel used for accumulating and holding electric charge. On the other hand, the correction pixel is a pixel not used for holding accumulated electric charge but used for merely generating only an aliasing signal of an electric-charge holding section. Then, an aliasing signal read out from a correction pixel in the vicinity of an image taking unit pixel is subtracted from a signal read out from the image taking unit pixel as a signal including an aliasing signal in order to correct the aliasing signal read out from the image taking unit pixel.

As explained before, an aliasing signal includes two main components, i.e., a leak component of the electric charge and a noise component generated in an opto-electric conversion process carried out by the electric-charge accumulation section (such as a floating diffusion area) itself. The leak component of the electric charge increases proportionally to the length of the elapsed time. The existing technology disclosed in Patent Document 2 makes use of the correlation of aliasing signals generated by pixels placed at locations close to each other.

As a result, however, a signal generated by a correction pixel not used for holding accumulated electric charge but used for merely generating only an aliasing signal of an electric-charge holding section is used only as a correction signal and, thus, does not function as a signal contributing to generation of an image. That is to say, as a result, if the correction pixels are provided for example alternately with image taking pixels on a matrix row or a matrix column, the number of effective unit pixels each generating a signal contributing to creation of an image becomes half the number of all pixels including the correction pixels. Thus, there is raised a problem that it is impossible to obtain a resolution commensurate with the number of all pixels.

There is a need for the present invention to provide a solid-state image taking apparatus capable of correcting an aliasing signal without reducing the number of effective pixels in order to obtain an excellent image having simultaneity of accumulation periods of all individual unit pixels, a method for driving the solid-state image taking apparatus and an electronic apparatus employing the solid-state image taking apparatus.

In order to achieve the need described above, the present invention provides a solid-state image taking apparatus provided with:

a pixel array section including unit pixels laid out two-dimensionally to form a matrix to serve as unit pixels each employing
- an opto-electric conversion device configured to carry out an opto-electric conversion process to convert incident light into signal electric charge and accumulate the signal electric charge,
- a transfer transistor configured to transfer the signal electric charge, which has been obtained as a result of the opto-electric conversion process carried out by the opto-electric conversion device and accumulated in the opto-electric conversion device, from the opto-electric conversion device to a first electric-charge accumulation section,
- the first electric-charge accumulation section configured to hold the signal electric charge transferred by the transfer transistor from the opto-electric conversion device,
- a read transistor configured to read out the signal electric charge held in the first electric-charge accumulation section and output the signal electric charge to a second electric-charge accumulation section,
- the second electric-charge accumulation section configured to hold the signal electric charge read out by the read transistor,
- a reset transistor configured to reset the second electric-charge accumulation section, and
- an amplification transistor configured to output an electrical signal representing the signal electric charge held in the second electric-charge accumulation section;

a driving section configured to drive the second electric-charge accumulation section from which an aliasing signal component corresponding to an aliasing signal component generated in the first electric-charge accumulation section during a period of holding the signal charge in the first electric-charge accumulation section should be obtained; and a correction section configured to correct a signal representing the signal electric charge, which is held in the first electric-charge accumulation section, by making use of the aliasing signal component obtained from the second electric-charge accumulation section.

In the solid-state image taking apparatus with a configuration described above, an aliasing signal component is generated in the first electric-charge accumulation section during a period between an operation to transfer signal electric charge from the opto-electric conversion device to the first electric-charge accumulation section and an operation to read out the signal electric charge from the first electric-charge accumulation section, that is, during a period in which the signal electric charge is being held in the first electric-charge accumulation section. An aliasing signal component corresponding to the aliasing signal component generated in the first electric-charge accumulation section is obtained from the second electric-charge accumulation section provided in the same unit pixel as the first electric-charge accumulation section. Then, by making use of the aliasing signal component obtained from the second electric-charge accumulation section, the correction section corrects a signal representing the signal electric charge held in the first electric-charge accumulation section, that is, a signal including the aliasing signal component generated in the first electric-charge accumulation section in order to obtain a signal according to the opto-electric conversion process carried out by the opto-electric conversion device as a signal with a reduced aliasing signal component or, desirably, as a signal with a cancelled aliasing signal component.

In accordance with the present invention, it is possible to obtain an aliasing signal component from the second electric-charge accumulation section provided in the same unit pixel as the first electric-charge accumulation section. Thus, by making use of the aliasing signal component obtained from the second electric-charge accumulation section, the aliasing signal component generated in the first electric-charge accumulation section can be corrected without reducing the number of effective unit pixels.

BRIEF DESCRIPTION OF THE DRAWINGS

FIG. 2 is a circuit diagram showing a typical circuit configuration of a unit pixel;

FIG. 3 is a circuit diagram showing another typical circuit configuration of the unit pixel;

DETAILED DESCRIPTION OF THE PREFERRED EMBODIMENTS

Forms each implementing the present invention are explained below in detail by referring to diagrams. In the following description, the forms each implementing the present invention are each referred to as an embodiment. It is to be noted that the present invention is explained in chapters arranged as follows.

1: Solid-State Image Taking Apparatus Provided by the Invention
1-1: Configuration of a CMOS Image Sensor
1-2: Circuit Configuration of a Unit Pixel
1-3: Pixel Structures of a Unit Pixel
2: Embodiments of the Invention
2-1: First Embodiment (Adopting no CDS)
2-2: Second Embodiment (Adopting no CDS and using an OPB)
2-3: Third Embodiment (Adopting CDS)
2-4: Fourth Embodiment (Adopting CDS and using an OPB)
3: Modified Versions
4: Electronic Apparatus (Image Taking Apparatus)

1: Solid-State Image Taking Apparatus Provided by the Invention

1-1: Configuration of a CMOS Image Sensor

Figure 1:
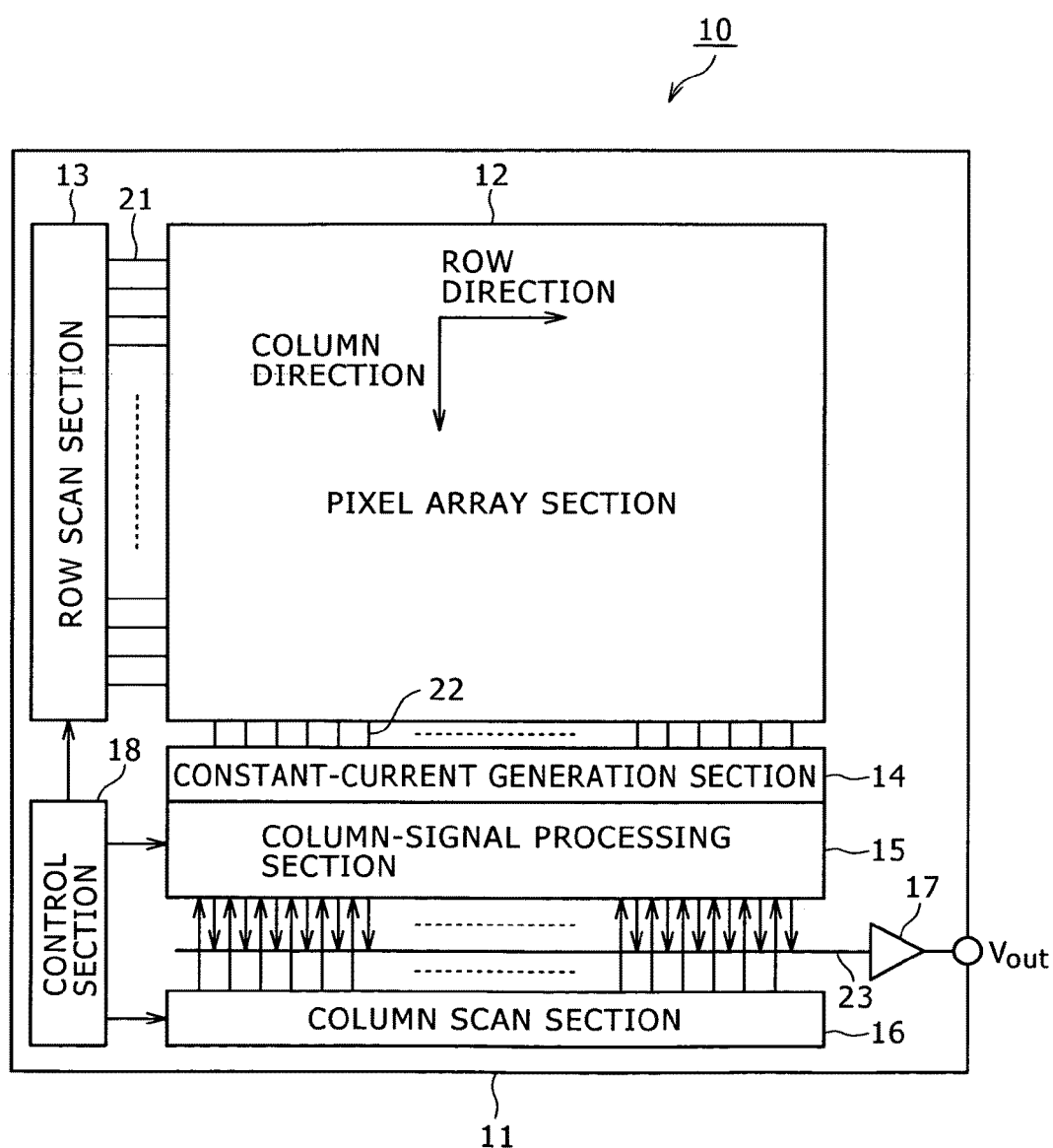
FIG. 1 is a diagram showing a rough system configuration of a Complementary Metal-Oxide Semiconductor, CMOS-type image sensor according to an embodiment of the present invention.

FIG. 1 is a diagram showing a rough system configuration serving as the configuration of a Complementary Metal-Oxide Semiconductor, CMOS-type image sensor 10 which is a kind of solid-state image taking apparatus provided by an embodiment of the present invention to function as a solid-state image taking apparatus typically adopting the X-Y address system. The CMOS-type image sensor 10 is an image sensor created by applying a CMOS process or by partially making use of the CMOS process.

The CMOS-type image sensor 10 provided by the embodiment of the present invention employs a pixel array section 12 created on a semiconductor substrate 11 and a peripheral circuit section also created on the same semiconductor substrate 11 as the pixel array section 12. The peripheral circuit section typically includes a row scan section 13, a constant-current generation section 14, a column-signal processing section 15, a column scan section 16, an output processing section 17 and a control section 18.

The pixel array section 12 is configured to include unit pixels laid out two-dimensionally in row and column directions to form a matrix. In the following description, the unit pixel is also referred to simply as a pixel in some cases. Each of the unit pixels includes an opto-electric conversion device for carrying out an opto-electric conversion process of converting light incident to the opto-electric conversion device into opto-electric charge represented by an optical signal and accumulating the opto-electric charge in the opto-electric conversion device. The amount of the opto-electric charge is proportional to the quantity of the incident light. The row direction is a direction in which the unit pixels are laid out in the matrix to form rows of the matrix. Thus, the row direction is also referred to as a horizontal direction. On the other hand, the column direction is a direction in which the unit pixels are laid out in the matrix to form columns of the matrix. Thus, the column direction is also referred to as a vertical direction. A concrete configuration of the circuit of the unit pixel will be described later in detail.

In the pixel array section 12, for the array of pixels laid out to form a matrix, a pixel driving line 21 is provided for every pixel row, being oriented in the row direction whereas a vertical signal line 22 is provided for every pixel column, being oriented in the column direction. The pixel driving line 21 conveys a driving signal for driving unit pixels on a row associated with the pixel driving line 21 in order to read out signals from the pixels. In the configuration shown in FIG. 1, for the pixel driving line 21, one wire is shown. However, the pixel driving line 21 is by no means limited to one wire. One end of the pixel driving line 21 is connected to an output terminal of the row scan section 13. The output terminal of the row scan section 13 is associated with a pixel row for which the pixel driving line 21 is provided.

The row scan section 13 is configured to include components such as a shift register and an address decoder. The row scan section 13 drives all unit pixels in the pixel array section 12 at the same time or in row units. That is to say, in conjunction with the control section 18 for controlling the row scan section 13, the row scan section 13 constitutes a driving section for driving the unit pixels in the pixel array section 12. A concrete configuration of the row scan section 13 is not shown in the figure. In general, however, the row scan section 13 is configured to include two scan systems, i.e., a read scan system and a sweep scan system.

In order to read out signals from unit pixels, the read scan system sequentially scans and selects the unit pixels in the pixel array section 12 in row units. A signal read out from a unit pixel is an analog signal. The sweep scan system carries out a sweep scan operation on a pixel row being subjected to a read scan operation carried out by the read scan system. The sweep scan operation leads ahead of the read scan operation by a time the length of which is determined by the speed of a shutter.

The sweep scan operation carried out by the sweep scan system sweeps unnecessary electric charge from an opto-electric conversion device employed in a unit pixel being subjected to the weep scan operation, resetting the opto-electric conversion device. The sweep scan system sweeps (or resets) unnecessary electric charge in order to carry out the so-called electronic shutter operation. The electronic shutter operation is an operation to discard opto-electric charge of the opto-electric conversion device and newly start an exposure, that is, newly start accumulation of opto-electric charge.

A signal read out from an opto-electric conversion device employed in a unit pixel in a read operation carried out by the read scan system has a magnitude determined by the quantity of light incident to the opto-electric conversion device during the immediately preceding read operation or incident to the opto-electric conversion device since the electronic shutter operation. A period between the read timing of the immediately preceding read operation or the sweep timing of the electronic shutter operation and the read timing of the present read operation is referred to as the period of accumulation of opto-electric charge in the unit pixel. In the following description, the period of accumulation of opto-electric charge is referred to as an exposure period.

Signals read out from unit pixels on a pixel row selected and scanned by the row scan section 13 are supplied to the constant-current generation section 14 and the column-signal processing section 15 for each pixel column through the vertical signal line 22. The constant-current generation section 14 is configured to include a constant-current generator 141, which is shown in FIG. 2, for every pixel column. The constant-current generator 141 supplies a bias current to unit pixels through the vertical signal line 22.

The column-signal processing section 15 carries out signal processing determined in advance on signals output by unit pixels on the selected pixel row of the pixel array section 12 through the vertical signal lines 22 for every pixel row. The signal processing carried out by the column-signal processing section 15 includes noise elimination processing based on CDS (Correlated Double Sampling), signal amplification processing and AD (Analog-Digital) conversion processing.

However, the above various kinds of signal processing are no more than typical examples. That is to say, the signal processing carried out by the column-signal processing section 15 is by no means limited to the aforementioned various kinds of signal processing. In addition, the column-signal processing section 15 may carry out one of the above various kinds of signal processing or a plurality of the above various kinds of signal processing. The signal processing carried out by the column-signal processing section 15 is a characteristic of the main embodiment of the present invention. Details of the signal processing will be described later.

The column scan section 16 is also configured to include components such as a shift register and an address decoder. The column scan section 16 sequentially selects unit circuits each employed in the column-signal processing section 15 as a circuit corresponding to a pixel column. The column scan section 16 selects and scans the unit circuits in order to sequentially supply a signal completing the signal processing carried out by the column-signal processing section 15 for every unit circuit to the output processing section 17 through a horizontal signal line 23.

The output processing section 17 carries out processing determined in advance on a signal selected and supplied by the column scan section 16 to the output processing section 17 through the horizontal signal line 23, outputting the processed signal to a recipient provided externally to the semiconductor substrate 11. The processing carried out by the output processing section 17 can be a buffering process only. As an alternative, prior to the buffering process, the output processing section 17 may also carry out various kinds of signal processing such as adjustment of the black level and correction of variations among pixel columns.

The control section 18 receives signals from sources provided externally to the semiconductor substrate 11. The signals provided by the external sources include a clock signal and a data signal making a request for an operation mode. In addition, the control section 18 also has a timing generation section for generating a variety of timing signals on the basis of the signals provided by the external sources. The control section 18 supplies the timing signals generated thereby to the peripheral circuit section including the row scan section 13, the column-signal processing section 15 and the column scan section 16 in order to drive and control the peripheral circuit section.

1-2: Circuit Configuration of a Unit Pixel

FIG. 2 is a circuit diagram showing a typical circuit configuration of the unit pixel 30. As shown in FIG. 2, the unit pixel 30 having the typical circuit configuration employs typically a photodiode 31 serving as an opto-electric conversion device also referred to as an opto-electric conversion section. In addition, the circuit configuration of the unit pixel 30 also has typically a transfer transistor 32, a first electric-charge accumulation section 33, a read transistor 34, a second electric-charge accumulation section 35, a reset transistor 36, an amplification transistor 37 and a select transistor 38.

As described above, the circuit configuration of the unit pixel 30 has five transistors, i.e., the transfer transistor 32, the read transistor 34, the reset transistor 36, the amplification transistor 37 and the select transistor 38. Typically, any of these transistors can be an N-channel Metal-Oxide Semiconductor, MOS transistor. However, the combination of conduction types of the transfer transistor 32, the read transistor 34, the reset transistor 36, the amplification transistor 37 and the select transistor 38 is no more than a typical combination of conduction types. That is to say, the conduction types of them are by no means limited to these conduction types. In other words, any one of these transistors can also be a P-channel MOS transistor.

Typically, four pixel driving lines 21 are connected to unit pixels 30 provided on a pixel row to serve as pixel driving lines 21 common to the unit pixels 30. The four pixel driving lines 21 are a pixel driving line $21_{-1}$, a pixel driving line $21_{-2}$, a pixel driving line $21_{-3}$ and a pixel driving line $21_{-4}$. One end of each of the pixel driving line $21_{-1}$, the pixel driving line $21_{-2}$, the pixel driving line $21_{-3}$ and the pixel driving line $21_{-4}$ is connected an output terminal provided on the row scan section 13 for the pixel row. That is to say, such a pixel driving line $21_{-1}$, a pixel driving line $21_{-2}$, a pixel driving line $21_{-3}$ and a pixel driving line $21_{-4}$ as well as such an output terminal of the row scan section 13 are provided for each pixel row. The pixel driving line $21_{-1}$, the pixel driving line $21_{-2}$, the pixel driving line $21_{-3}$ and the pixel driving line $21_{-4}$ convey respectively a transfer pulse TRG, a read pulse ROG, a reset pulse RST and a select pulse SEL which each function as a driving signal for driving the unit pixel 30.

The anode electrode of the photodiode 31 is connected to the negative side of a power supply. Typically, the negative side of the power supply is connected to the ground GND. The photodiode 31 carries out an opto-electric conversion process to convert light incident to the photodiode 31 into opto-electric charge which has an amount proportional to the quantity of the incident light and accumulates the opto-electric charge in the photodiode 31. In this case, the opto-electric charge obtained as a result of the opto-electric conversion process is photoelectrons. A specific one of the two electrodes of the transfer transistor 32 is connected to the cathode electrode of the photodiode 31. By the specific one of the two electrodes of the transfer transistor 32, the source or drain electrode of the transfer transistor 32 is implied. The gate electrode of the transfer transistor 32 is connected to the pixel driving line $21_{-1}$.

A specific one of the two electrodes of the first electric-charge accumulation section 33 is connected to the other one of the two electrodes of the transfer transistor 32. By the other one of the two electrodes of the transfer transistor 32, the drain or source electrode of the transfer transistor 32 is implied. On the other hand, the other one of the two electrodes of the first electric-charge accumulation section 33 is connected to the negative side of the power supply. A specific one of the two electrodes of the read transistor 34 is connected to the other one of the two electrodes of the transfer transistor 32. By the specific one of the two electrodes of the read transistor 34, the source or drain electrode of the read transistor 34 is implied. As described above, the other one of the two electrodes of the transfer transistor 32 is connected to the specific one of the two electrodes of the first electric-charge accumulation section 33. The gate electrode of the read transistor 34 is connected to the pixel driving line $21_{-2}$.

A specific one of the two electrodes of the second electric-charge accumulation section 35 is connected to the other one of the two electrodes of the read transistor 34. By the other one of the two electrodes of the read transistor 34, the drain or source electrode of the read transistor 34 is implied. On the other hand, the other one of the two electrodes of the second electric-charge accumulation section 35 is connected to the negative side of the power supply. The gate electrode of the reset transistor 36 is connected to the pixel driving line $21_{-3}$. The drain electrode of the reset transistor 36 is connected to the positive side of the power supply. In the following description, the positive side of the power supply is also referred to simply as the power supply $V_{DD}$. The source of the reset transistor 36 is connected to the other one of the two electrodes of the read transistor 34. As described above, the other one of the two electrodes of the read transistor 34 is connected to the specific one of the two electrodes of the second electric-charge accumulation section 35.

The gate electrode of the amplification transistor 37 is connected to the other one of the two electrodes of the read transistor 34. As described above, the other one of the two electrodes of the read transistor 34 is connected to the specific one of the two electrodes of the second electric-charge accumulation section 35. The drain electrode of the amplification transistor 37 is connected to the power supply $V_{DD}$. The gate electrode of the select transistor 38 is connected to the pixel driving line $21_{-4}$ whereas the drain electrode of the select transistor 38 is connected to the source electrode of the amplification transistor 37. The source electrode of the select transistor 38 is connected to the vertical signal line 22.

The row scan section 13 selectively supplies the transfer pulse TRG to the gate electrode of the transfer transistor 32 through the pixel driving line $21_{-1}$. The row scan section 13 selectively supplies the read pulse ROG to the gate electrode of the read transistor 34 through the pixel driving line $21_{-2}$. The row scan section 13 selectively supplies the reset pulse RST to the gate electrode of the reset transistor 36 through the pixel driving line $21_{-3}$. The row scan section 13 selectively supplies the select pulse SEL to the gate electrode of the select transistor 38 through the pixel driving line $21_{-4}$.

As described above, each of the transfer transistor 32, the read transistor 34, the reset transistor 36, the amplification transistor 37 and the select transistor 38 is an N-channel MOS transistor. Thus, each of the transfer pulse TRG, the read pulse ROG, the reset pulse RST and the select pulse SEL is an active high signal which is defined as a signal put in an active state when set at a high level such as the level of the power supply $V_{DD}$.

In the unit pixel 30 having the configuration described above, the transfer transistor 32 enters a conductive state in response to an operation to set the transfer pulse TRG in an active state. In this state, electric charge obtained as a result of the photo-electric conversion process carried out by the photodiode 31 is transferred to the first electric-charge accumulation section 33 by way of the transfer transistor 32. The first electric-charge accumulation section 33 is thus used for storing the electric charge obtained as a result of the photo-electric conversion process carried out by the photodiode 31, accumulated in the photodiode 31 and transferred from the photodiode 31 to the first electric-charge accumulation section 33 by way of the transfer transistor 32 to store the accumulated electric charge.

The read transistor 34 enters a conductive state in response to an operation to set the read pulse ROG in an active state. In this state, the electric charge stored in the first electric-charge accumulation section 33 is transferred to the second electric-charge accumulation section 35 by way of the read transistor 34. The second electric-charge accumulation section 35 is used for storing the electric charge transferred from the first electric-charge accumulation section 33 and for storing a noise component generated during a period between the end of the operation carried out by the photodiode 31 to accumulate the electric charge in the photodiode 31 and the start of the operation carried out by the read transistor 34 to transfer the electric charge from the first electric-charge accumulation section 33 to the second electric-charge accumulation section 35.

The reset transistor 36 enters a conductive state in response to an operation to set the reset pulse RST in an active state. In this state, the electric charge stored in the second electric-charge accumulation section 35 is discarded to the power supply $V_{DD}$ in order to reset the second electric-charge accumulation section 35.

The amplification transistor 37 serves as the input member of the so-called source follower circuit serving as a read circuit for reading out a signal obtained as a result of the opto-electric conversion process carried out by the photodiode 31. That is to say, since the source electrode of the amplification transistor 37 is connected to the vertical signal line 22 through the select transistor 38, the amplification transistor 37 forms the source follower circuit in conjunction with the constant-current generator 141 connected to one end of the vertical signal line 22.

The select transistor 38 enters a conductive state in response to an operation to set the select pulse SEL in an active state. In this state, the unit pixel 30 is put in a state of being selected. With the select transistor 38 put in the conductive state, the unit pixel 30 relays a signal output by the amplification transistor 37 to the vertical signal line 22.

As described above, in accordance with the unit pixel 30 having a circuit configuration including the two electric-charge accumulation section, i.e., the first electric-charge accumulation section 33 and the second electric-charge accumulation section 35, it is possible to implement a global shutter (or a global exposure mechanism) for realizing an exposure start and an exposure end with the same timing for all the unit pixels 30 included in the pixel array section 12. The operation of the global shutter will be explained in detail later.

It is to be noted that the unit pixel 30 shown in FIG. 2 may also have a circuit configuration in which the select transistor 38 is connected between the power supply $V_{DD}$ and the drain electrode of the amplification transistor 37.

In addition, implementations of the unit pixel 30 are by no means limited to the circuit configuration having five transistors, i.e., the transfer transistor 32, the read transistor 34, the reset transistor 36, the amplification transistor 37 and the select transistor 38. That is to say, the unit pixel 30 may also have another circuit configuration such as a typical configuration including an electric-charge discharging transistor 39 in addition to the transfer transistor 32, the read transistor 34, the reset transistor 36, the amplification transistor 37 and the select transistor 38 as shown in FIG. 3.

The electric-charge discharging transistor 39 is provided between the photodiode 31 and an electric-charge discharge node such as the power-supply wire of the power supply $V_{DD}$. The gate electrode of the electric-charge discharging transistor 39 receives an electric-charge discharging signal OFG conveyed by a electric-charge discharging driving line $21_{-5}$, putting the electric-charge discharging transistor 39 in a conductive state. With the electric-charge discharging transistor 39 put in the conductive state, opto-electric charge accumulated in the photodiode 31 is selectively discarded (or discharged) to the electric-charge discharge node.

The electric-charge discharging transistor 39 is provided for the following purpose. In a period of accumulating no opto-electric charge, the electric-charge discharging transistor 39 is put in a conductive state in order to prevent electric charge of an amount above the amount of saturated electric charge from leaking out from the photodiode 31 to the first electric-charge accumulation section 33, the second electric-charge accumulation section 35 and surrounding unit pixels 30. The opto-electric charge accumulated in the photodiode 31 gets saturated due to excessive light incident to the photodiode 31, increasing the amount of the opto-electric charge to a value greater than the amount of saturated electric charge.

As is obvious from the above description, the circuit configuration of the unit pixel 30 employed in this main embodiment is provided that the configuration including at least the two electric-charge accumulation sections, i.e., the first electric-charge accumulation section 33 and the second electric-charge accumulation section 35 for implementing a global shutter (or a global exposure mechanism) in addition to the transfer transistor 32, the read transistor 34, the reset transistor 36, the amplification transistor 37 and the select transistor 38.

1-3: Pixel Structures of a Unit Pixel

Next, the structure of the unit pixel 30 is explained. In particular, the following description mainly explains the structure of the first electric-charge accumulation section 33. The first electric-charge accumulation section 33 is employed in the unit pixel 30 to form typical structures such as first, second and third pixel structures which are different from each other due to different structures of the first electric-charge accumulation section 33. That is to say, the first pixel structure includes a floating diffusion area in the first electric-charge accumulation section 33 whereas the second pixel structure includes an embedded diode in the first electric-charge accumulation section 33. On the other hand, the third pixel structure includes the same embedded channel as a CCD (Charge Coupled Device) in the first electric-charge accumulation section 33.

First Pixel Structure

Figure 4:
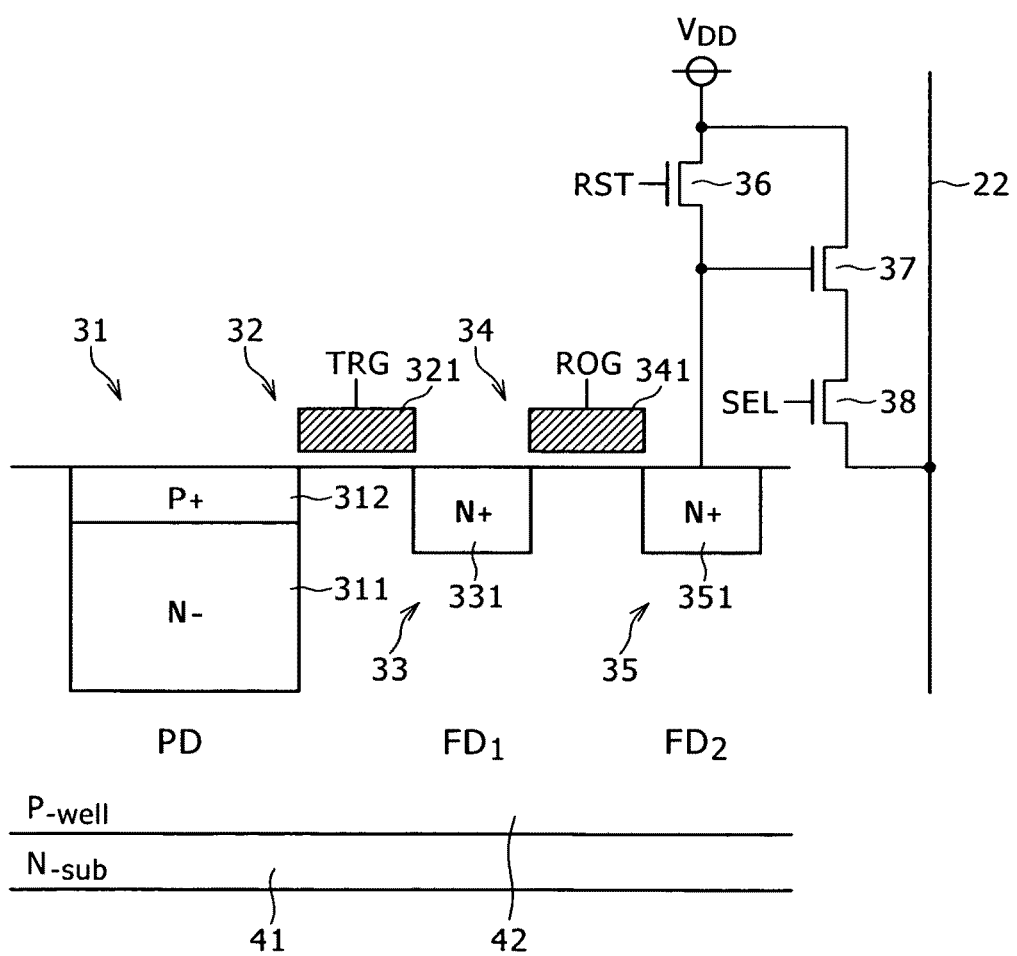
FIG. 4 is a cross-sectional diagram showing a typical configuration of a unit pixel including a first electric-charge accumulation section having a first pixel structure.
Figure 5:
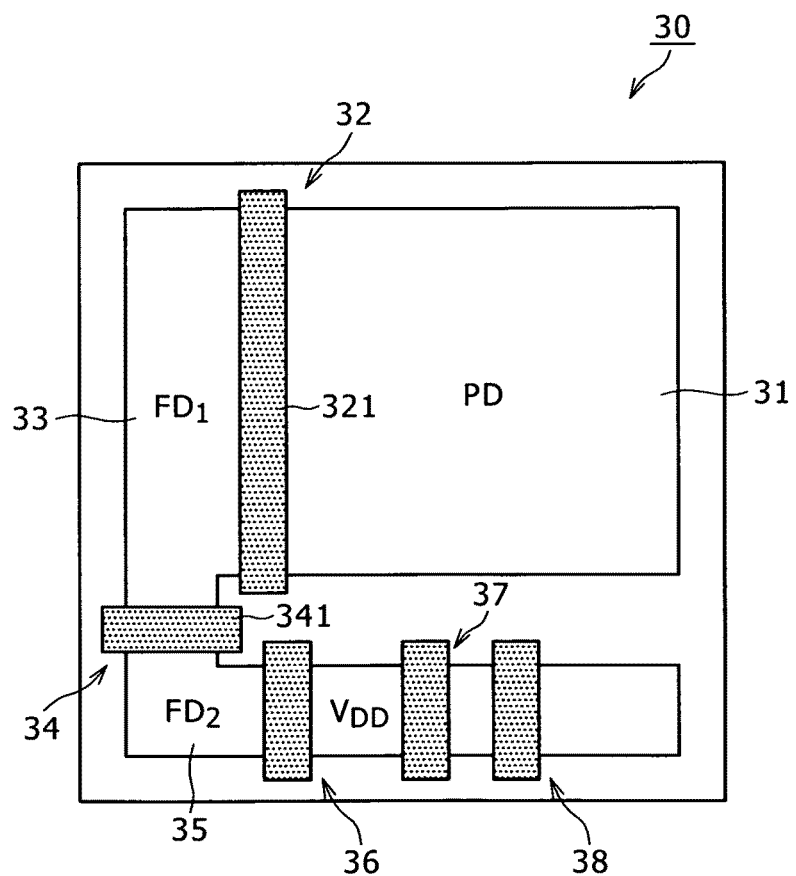
FIG. 5 is a diagram showing a typical layout structure of the unit pixel including a first electric-charge accumulation section having the first pixel structure.

FIG. 4 is a cross-sectional diagram showing a typical structure of the unit pixel 30 including the first electric-charge accumulation section 33 forming the first pixel structure. In the typical structure shown in FIG. 4, components identical with their counterparts employed in the structure shown in FIG. 2 are denoted by the same reference numerals and the same reference symbols as the counterparts. In addition, FIG. 5 is a diagram showing a typical layout structure of the unit pixel 30 including the first electric-charge accumulation section 33 forming the first pixel structure.

In the typical structure shown in FIG. 4, the photodiode 31, the first electric-charge accumulation section 33 and the second electric-charge accumulation section 35 are created typically in a P-type well area 42 formed on a semiconductor substrate such as an N-type substrate 41. The N-type substrate 41 used in this typical structure corresponds to the semiconductor substrate 11 shown in FIG. 1.

The photodiode 31 is a photodiode having a PN junction. The photodiode 31 (also denoted by reference symbol PD) is created by forming an $N^-$-type signal accumulation area 311 in the P-type well area 42. In addition, the photodiode 31 is provided with a $P^+$-type layer 312 on the surface layer section (or the outermost surface section) of the N-type substrate 41 in order to create a structure in which a depletion layer end of the transfer transistor 32 is separated from a boundary surface.

The photodiode 31 having the structure described above is referred to as an embedded-type photodiode. The photodiode 31 having the structure described above is also referred to as an HAD (Hole Accumulated Diode) sensor in some cases. In the embedded-type photodiode 31, the $P^+$-type layer 312 functions as a layer used for accumulating holes. By carrying out the function of the $P^+$-type layer 312 employed in the embedded-type photodiode 31, it is possible to avoid generation of a dark current.

The first electric-charge accumulation section 33 is configured as an $N^+$-type floating diffusion area 331 (also shown as a floating diffusion area $FD_1$) formed on the surface layer section of the N-type substrate 41. An area between the $N^-$-type signal accumulation area 311 of the photodiode 31 and the $N^+$-type floating diffusion area 331 of the first electric-charge accumulation section 33 is used as a channel area of the transfer transistor 32. The gate electrode 321 of the transfer transistor 32 is provided above the channel area, being separated away from the channel area by a gate insulation layer not shown in the figure.

In the same way as the first electric-charge accumulation section 33, the second electric-charge accumulation section 35 is configured as an $N^+$-type floating diffusion area 351 (also shown as a floating diffusion area $FD_2$) formed on the surface layer section of the N-type substrate 41. An area between the $N^+$-type floating diffusion area 331 of the first electric-charge accumulation section 33 and the $N^+$-type floating diffusion area 351 of the second electric-charge accumulation section 35 is used as a channel area of the read transistor 34. The gate electrode 341 of the read transistor 34 is provided above the channel area, being separated away from the channel area by a gate insulation layer also not shown in the figure.

Second Pixel Structure

Figure 6:
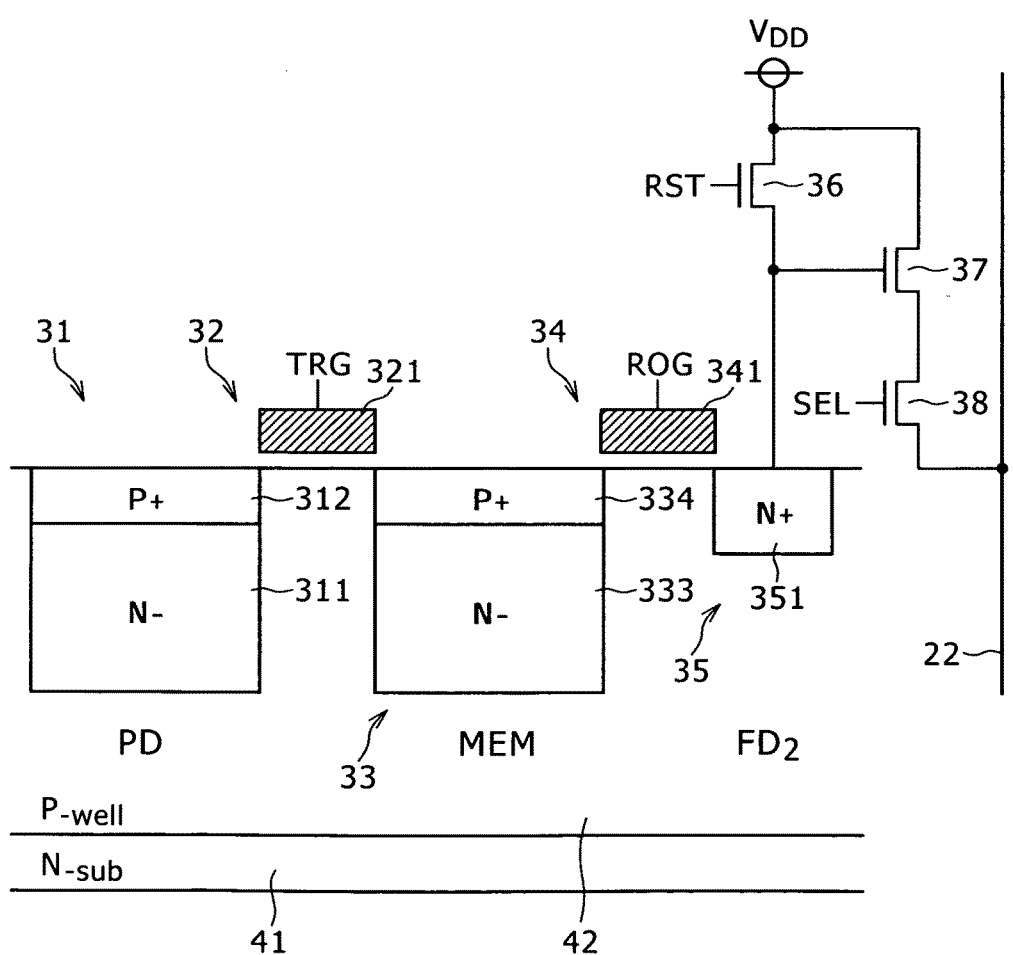
FIG. 6 is a cross-sectional diagram showing a typical configuration of a unit pixel including a first electric-charge accumulation section having a second pixel structure.

FIG. 6 is a cross-sectional diagram showing a typical configuration of the unit pixel 30 including the first electric-charge accumulation section 33 forming the second pixel structure. In the typical structure shown in FIG. 6, components identical with their counterparts employed in the structure shown in FIG. 4 are denoted by the same reference numerals and the same reference symbols as the counterparts.

In the typical structure shown in FIG. 6, the photodiode 31 (also denoted by reference symbol PD), the first electric-charge accumulation section 33 (also denoted by reference symbol MEM) and the second electric-charge accumulation section 35 (also denoted by reference symbol $FD_2$) are created typically in a P-type well area 42 formed on a semiconductor substrate such as an N-type substrate 41. Much like the photodiode 31 employed in the unit pixel 30 including the first electric-charge accumulation section 33 forming the first pixel structure, the photodiode 31 employed in the unit pixel 30 including the first electric-charge accumulation section 33 forming the second pixel structure is also an embedded-type photodiode.

The first electric-charge accumulation section 33 is configured as an $N^+$-type impurity layer 333 created in the P-type well area 42 and a $P^+$-type layer 334 provided on the $N^+$-type impurity layer 333. That is to say, in the same way as the photodiode 31, the first electric-charge accumulation section 33 has an embedded structure (referred to as the HAD structure) including the $P^+$-type layer 334 created on the surface layer section of the N-type substrate 41. In accordance with the first electric-charge accumulation section 33 having such an embedded structure, the first electric-charge accumulation section 33 offers a merit that the first electric-charge accumulation section 33 is capable of avoiding generation of a dark current in comparison with the first electric-charge accumulation section 33 forming the first pixel structure. The first electric-charge accumulation section 33 is shielded from light.

In the same way as the second electric-charge accumulation section 35 employed in the unit pixel 30 including the first electric-charge accumulation section 33 forming the first pixel structure, the second electric-charge accumulation section 35 employed in the unit pixel 30 including the first electric-charge accumulation section 33 forming the second pixel structure is configured as a $N^+$-type floating diffusion area 351 formed on the surface layer section of the N-type substrate 41. In addition, the second electric-charge accumulation section 35 is provided with a contact section to be electrically connected to the gate electrode of the amplification transistor 37. Thus, the second electric-charge accumulation section 35 cannot adopt the embedded structure such as the one taken by the first electric-charge accumulation section 33. It is to be noted that the contact section is shown in none of the figures.

Third Pixel Structure

Figure 7:
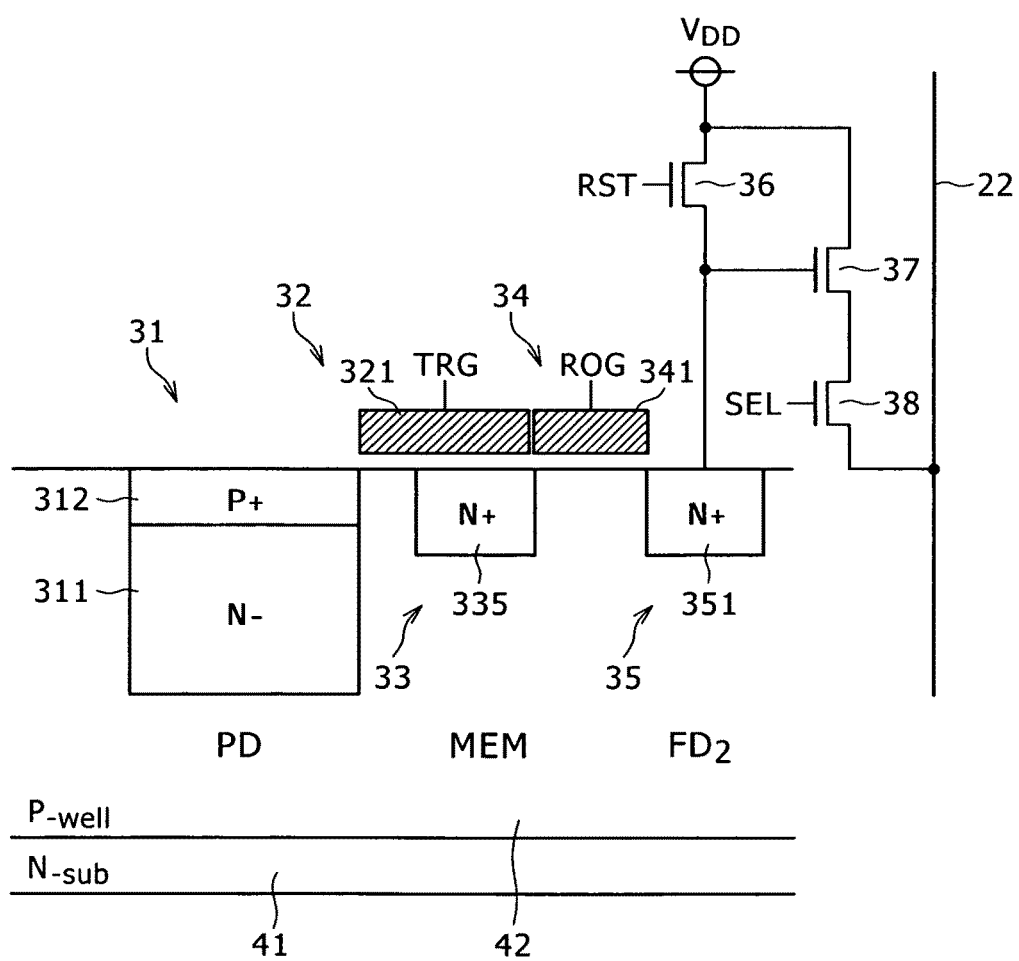
FIG. 7 is a cross-sectional diagram showing a typical configuration of a unit pixel including a first electric-charge accumulation section having a third pixel structure.

FIG. 7 is a cross-sectional diagram showing a typical configuration of the unit pixel 30 including the first electric-charge accumulation section 33 forming the third pixel structure. In the typical structure shown in FIG. 7, components identical with their counterparts employed in the structure shown in FIG. 4 are denoted by the same reference numerals and the same reference symbols as the counterparts.

In the typical structure shown in FIG. 7, the photodiode 31 (also denoted by reference symbol PD), the first electric-charge accumulation section 33 (also denoted by reference symbol MEM) and the second electric-charge accumulation section 35 (also denoted by reference symbol $FD_2$) are created typically in a P-type well area 42 formed on a semiconductor substrate such as an N-type substrate 41.

Much like the photodiode 31 employed in the unit pixel 30 including the first electric-charge accumulation section 33 forming the first pixel structure, the photodiode 31 employed in the unit pixel 30 including the first electric-charge accumulation section 33 forming the third pixel structure is also an embedded-type photodiode. In the same way as the second electric-charge accumulation section 35 employed in the unit pixel 30 including the first electric-charge accumulation section 33 forming the first pixel structure, the second electric-charge accumulation section 35 employed in the unit pixel 30 including the first electric-charge accumulation section 33 forming the third pixel structure is also configured as a $N^+$-type floating diffusion area 351 formed on the surface layer section of the N-type substrate 41.

The first electric-charge accumulation section 33 is configured as an $N^+$-type impurity layer 335 created in the P-type well area 42. Unlike the first pixel structure, however, the gate electrode 321 of the transfer transistor 32 has a structure extended to a position above the $N^+$-type impurity layer 335. That is to say, the first electric-charge accumulation section 33 has the same structure as the CCD.

2: Embodiments of the Invention

By providing every unit pixel 30 with the two electric-charge accumulation sections, i.e., the first electric-charge accumulation section 33 and the second electric-charge accumulation section 35 which are described above, the solid-state image taking apparatus is made capable of implementing a global shutter (or a global exposure mechanism). An embodiment implementing such a solid-state image taking apparatus is characterized in that the solid-state image taking apparatus is capable of correcting an aliasing signal without sacrificing the number of effective unit pixels. By adopting a global shutter system to serve as an electronic shutter, it is possible to produce an excellent image having simultaneity of accumulation periods of all individual unit pixels.

The aliasing signal cited above is noise components generated on a signal, which is held in the first electric-charge accumulation section 33 at the end of an accumulation, during a period ending at an operation to read out the signal. As described before, strictly speaking, this aliasing signal is composed of two components. One of the two components is an electric-charge leak component having a magnitude increasing proportionally to the length of the elapsed time. The other component is a noise component generated in an opto-electric conversion process carried out by an electric-charge accumulation section itself such as a floating diffusion area. By the way, as is generally known, also in the floating diffusion area used as the electric-charge accumulation section, an opto-electric conversion process is carried out at a sensitivity which is very low in comparison with the sensitivity of the opto-electric conversion process carried out in the photodiode. Typically, the sensitivity of the opto-electric conversion process carried out in the electric-charge accumulation section has a value of the order of $\frac{1}{10,000}$ times the sensitivity of the opto-electric conversion process carried out in the photodiode.

In the solid-state image taking apparatus capable of realizing a global shutter, in order for an embodiment implementing the solid-state image taking apparatus to correct an aliasing signal without sacrificing the number of effective unit pixels, it is necessary to adopt a driving method described in detail as follows. That is to say, in the CMOS-type image sensor 10 employing unit pixels 30 each having a configuration shown in FIG. 2, first of all, the photodiode 31 of every unit pixel 30 is reset in a batch reset operation in order to start an accumulation period to accumulate signal electric charge in the photodiode 31. Then, at the end of the accumulation period, the first electric-charge accumulation section 33 and the second electric-charge accumulation section 35 are reset.

Subsequently, a significant pulse is supplied to the transfer transistor 32 in order to transfer the signal electric charge accumulated in the photodiode 31 to the first electric-charge accumulation section 33 by way of the transfer transistor 32 in a batch transfer operation. The significant pulse is a pulse signal for putting the transfer transistor 32 in a conductive state. In the embodiment, the transfer transistor 32 is an N-channel transistor. Thus, a pulse signal having a high level such as the voltage level of the power supply $V_{DD}$ is used as the significant pulse. By the way, if the transfer transistor 32 is a P-channel transistor, a pulse signal having a low level such as the voltage level of a negative power supply is used as the significant pulse. A typical example of the voltage level of a negative power supply is the voltage level of the ground GND. This explanation of the significant pulse applied to the transfer transistor 32 holds true for a significant pulse supplied to each of the read transistor 34, the reset transistor 36 and the select transistor 38.

After the signal electric charge has been transferred to the first electric-charge accumulation section 33 in a batch transfer operation, the pixel array section 12 is subjected to a row-after-row read operation carried out by sequentially scanning the pixel array section 12 in pixel-row units on one pixel row after another. In this row-after-row read operation, the select pulse (or the select signal) SEL applied to a pixel row being read is put in a significant (or active) state, first of all, in order to read out the signal level of the second electric-charge accumulation section 35. The signal level of the second electric-charge accumulation section 35 in a state of being reset is referred to as a first signal level. Then, a significant pulse is supplied to the read transistor 34 in order to transfer signal electric charge accumulated in the first electric-charge accumulation section 33 to the second electric-charge accumulation section 35 by way of the read transistor 34. Subsequently, the signal level exhibited by the second electric-charge accumulation section 35 in accordance with the amount of the signal electric charge accumulated in the second electric-charge accumulation section 35 is read out as a second signal level.

Afterwards, in order to reduce the magnitude of the aliasing signal or to cancel the aliasing signal, the column-signal processing section 15 or a signal processing section external to the semiconductor substrate 11 corrects the signal level, which has been read out later as the second signal level from the second electric-charge accumulation section 35, by making use of the signal level read out earlier as the first signal level from the second electric-charge accumulation section 35. To put it concretely, the column-signal processing section 15 or the signal processing section external to the semiconductor substrate 11 subtracts the first signal level from the second signal level in order to reduce the magnitude of the aliasing signal or to cancel the aliasing signal. In the operation carried out in order to reduce the magnitude of the aliasing signal or to cancel the aliasing signal, the column-signal processing section 15 or the signal processing section external to the semiconductor substrate 11 functions as a correction section for correcting the aliasing signal.

In this case, the first and second signal levels are both a signal level read out from the same unit pixel as a unit pixel for generating the level of a signal to be displayed. That is to say, since a correction pixel to serve as a pixel dedicated for the correction of the aliasing signal is not required at all, the aliasing signal can be corrected without reducing the number of effective unit pixels. As a result, it is possible to produce an excellent image having simultaneity of accumulation periods of all individual unit pixels. In addition, it is also possible to obtain a resolution commensurate with the number of effective unit pixels included in the CMOS-type image sensor 10.

Next, the following description explains concrete embodiments each implementing a driving method for carrying out a driving operation to correct the aliasing signal without reducing the number of effective unit pixels.

2-1: First Embodiment

Figure 8:
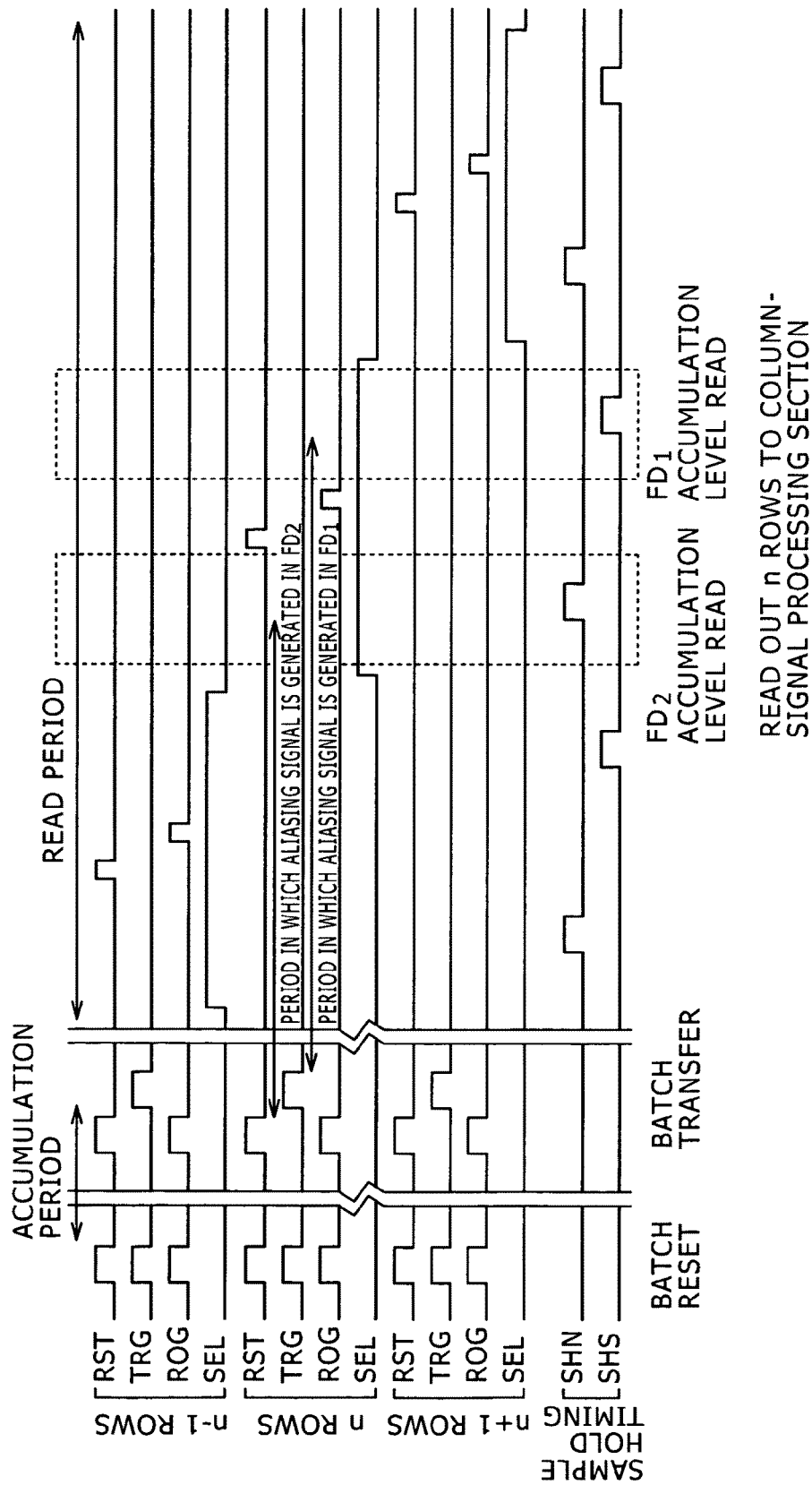
FIG. 8 shows timing charts to be referred to in explanation of a driving operation carried out by adoption of a driving method according to a first embodiment.

FIG. 8 shows timing charts referred to the following explanation of a driving operation carried out by adoption of a driving method according to a first embodiment.

First of all, a transfer pulse (or a transfer signal) TRG, a read pulse (or a read signal) ROG and a reset pulse (or a reset signal) RST which are each set at a high level are supplied to the transfer transistor 32, the read transistor 34 and the reset transistor 36 respectively for all pixel rows at the same time. Thus, the photodiode 31, the first electric-charge accumulation section 33 and the second electric-charge accumulation section 35 in all the unit pixels 30 are reset in a batch operation referred to as a reset batch operation.

To put it concretely, the reset transistor 36 turns on, resetting the second electric-charge accumulation section 35 at the high level of the power supply $V_{DD}$. In addition, the read transistor 34 turns on, resetting the first electric-charge accumulation section 33 at the high level of the power supply $V_{DD}$. On top of that, the transfer transistor 32 turns on, resetting the photodiode 31 at the high level of the power supply $V_{DD}$. It is to be noted that, in the case of the pixel configuration shown in FIG. 3, the electric-charge discharging transistor 39 can be turned on in order to reset the photodiode 31 at the high level of the power supply $V_{DD}$. With the timing of the reset batch operation, the operation to accumulate signal electric charge in the photodiode 31 for all unit pixels is started.

With a timing immediately prior to the end of the operation to accumulate signal electric charge in the photodiode 31, the read pulse ROG and the reset pulse RST which have been set at a high level are supplied to the read transistor 34 and the reset transistor 36 respectively for all pixel rows at the same time. Thus, a batch reset operation is carried out on the first electric-charge accumulation section 33 and the second electric-charge accumulation section 35. To put it concretely, the reset transistor 36 turns on, resetting the second electric-charge accumulation section 35 at the high level of the power supply $V_{DD}$ whereas the read transistor 34 turns on, resetting the first electric-charge accumulation section 33 at the high level of the power supply $V_{DD}$.

After the batch reset operation has been carried out on the first electric-charge accumulation section 33 and the second electric-charge accumulation section 35, the transfer pulse TRG set at a high level is supplied to the transfer transistor 32 for all pixel rows at the same time. Thus, signal electric charge accumulated in the photodiode 31 is transferred to the first electric-charge accumulation section 33 in a batch operation referred to as a batch transfer operation.

Then, a read operation is carried out for all pixel rows or for some desired pixel rows sequentially on one pixel row after another. This read operation is carried out by properly supplying the select pulse SEL, the reset pulse RST and the read pulse ROG which have each been set at the high level to the select transistor 38, the reset transistor 36 and the read transistor 34 respectively.

In the read operation carried out for pixel rows sequentially on one pixel row after another, the later the position of a pixel row to be read, the longer the time elapsing since the batch transfer operation. In addition, the magnitude of the aliasing signal added to a signal generated by the first electric-charge accumulation section 33 during the period (or the time) between the batch transfer operation and the read operation increases. As described before, the aliasing signal includes a leak component and a noise component generated in an opto-electric conversion process carried out by the first electric-charge accumulation section 33 itself to convert light incident to the first electric-charge accumulation section 33 into the signal generated by the first electric-charge accumulation section 33. In this embodiment, in order to correct the aliasing signal, the second electric-charge accumulation section 35 is provided with a function to generate aliasing signal components for the correction.

In this case, the first electric-charge accumulation section 33 and the second electric-charge accumulation section 35 are subjected to a reset operation immediately prior to a batch transfer operation carried out to transfer signal electric charge accumulated in the photodiode 31 to the first electric-charge accumulation section 33. Thus, the timing to start the generation of an aliasing signal in the second electric-charge accumulation section 35 approximately coincides with the timing to start the generation of an aliasing signal in the first electric-charge accumulation section 33.

Then, with a row read timing, the select pulse SEL set at the high level is supplied to the select transistor 38 of every unit pixel 30 on the read pixel row, which is a pixel row serving as an object of the read operation, in order to put the unit pixels 30 on the read pixel row in a state of being selected. With the unit pixel 30 put in a state of being selected, a signal output to the vertical signal line 22 connected to the selected pixel row is made valid. In this state of being selected, first of all, an aliasing signal $V_n$ representing the amount of electric charge accumulated in the second electric-charge accumulation section 35 also denoted by reference symbol $FD_2$ is output as a $V\_FD_2$ aliasing signal of the second electric-charge accumulation section 35.

Then, the reset pulse RST set at the high level is supplied to the reset transistor 36 in order to reset the second electric-charge accumulation section 35. Subsequently, the read pulse ROG set at the high level is supplied to the read transistor 34 in order to transfer electric charge accumulated in the first electric-charge accumulation section 33 to the second electric-charge accumulation section 35. The electric charge accumulated in the first electric-charge accumulation section 33 is electric charge obtained as a result of superposing aliasing-signal components on signal electric charge (or opto-electric charge) accumulated by the photodiode 31. Then, an optical signal $V_s$ representing the amount of electric charge accumulated in the second electric-charge accumulation section 35 at that time is output as an optical signal (V_accumulated signal+V_FD$_1$ aliasing signal) including the aliasing signal of the first electric-charge accumulation section 33 also denoted by reference symbol $FD_1$.

Later on, the select pulse SEL is changed from the high level to a low level in order to end the read operation carried out on the selected pixel row.

In the read operation carried out on the selected pixel row as described above, the read timings of the first electric-charge accumulation section 33 and the second electric-charge accumulation section 35 are made close to each other. Thus, the leak component generated in a period between the batch transfer operation and the read operation can be considered to have a correlation between the first electric-charge accumulation section 33 and the second electric-charge accumulation section 35. In particular, if the first electric-charge accumulation section 33 and the second electric-charge accumulation section 35 are provided in the same unit pixel 30 including the first electric-charge accumulation section 33 forming the first pixel structure shown in FIG. 4 or the third pixel structure shown in FIG. 7, the first electric-charge accumulation section 33 has a structure close (or similar) to the structure of the second electric-charge accumulation section 35. Thus, in this case, the correlation between the first electric-charge accumulation section 33 and the second electric-charge accumulation section 35 is considered to be a stronger correlation.

Accordingly, on the assumption that the equation V_FD$_1$ aliasing signal=V_FD$_2$ aliasing signal holds true for example, the aliasing signals can be cancelled by carrying out processing to subtract the aliasing signal $V_n$ (=V_FD$_2$ aliasing signal) read out earlier from the optical signal $V_s$ (=V_accumulated signal+V_FD$_1$ aliasing signal) read out later. This subtraction processing can be carried out by the column-signal processing section 15 or the signal processing section external to the semiconductor substrate 11.

The following description concretely explains typical processing carried out for example by the column-signal processing section 15 to subtract the aliasing signal $V_n$ (=V_FD$_2$ aliasing signal) from the optical signal $V_s$ (=V_accumulated signal+V_FD$_1$ aliasing signal).

Subtraction Processing Using a Subtractor

Figure 9:
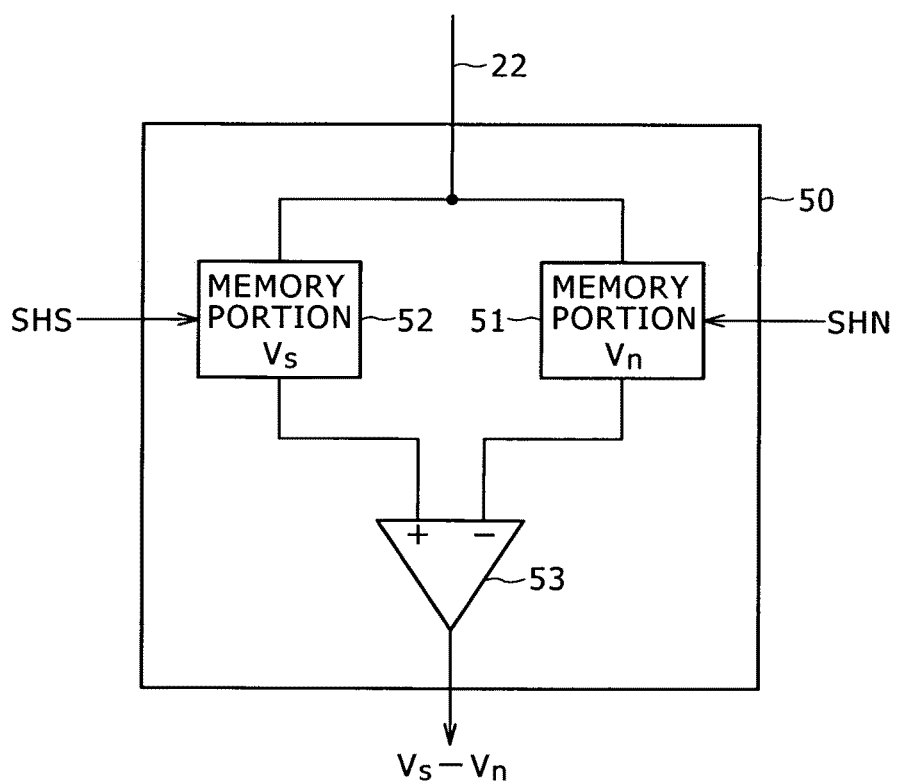
FIG. 9 is a block diagram showing a typical configuration of a subtraction processing block employed in a signal processing section to serve as a section for carrying out processing to subtract an aliasing signal from an optical signal.

FIG. 9 is a block diagram showing a typical configuration of a subtraction processing block 50 employed in the column-signal processing section 15 to serve as a section for carrying out processing to subtract the aliasing signal $V_n$ from the optical signal $V_s$.

The subtraction processing block 50 is provided typically for every pixel column. However, the subtraction processing block 50 can also be provided not for every pixel column. For example, it is also possible to provide a configuration in which a subtraction processing block 50 is provided for every unit including a plurality of pixel columns. In such a configuration, the subtraction processing block 50 is used for the pixel columns of the unit on a time-sharing basis.

As shown in FIG. 9, the subtraction processing block 50 is configured to employ a subtractor 53 as well as two memory portions denoted by reference numerals 51 and 52 respectively. In this subtraction processing block 50, as shown in the timing charts of FIG. 8, after the aliasing signal $V_n$ has been read out as an aliasing signal (V_FD$_2$ aliasing signal), a sampling pulse SHN set at a high level is supplied to the memory portion 51 which is a specific one of the two memory portions cited above. Thus, the aliasing signal $V_n$ is stored in the memory portion 51.

Then, after the optical signal $V_s$ has been read out as an optical signal (V_accumulated signal+V_FD$_1$ aliasing signal), a sampling pulse SHS set at a high level is supplied to the memory portion 52 which is the other one of the two memory portions cited above. Thus, the optical signal $V_s$ is stored in the memory portion 52. Subsequently, after the aliasing signal $V_n$ and the optical signal $V_s$ have been stored in the memory portions 51 and 52 respectively, the subtractor 53 carries out processing to subtract the aliasing signal (V_FD$_2$ aliasing signal) from the optical signal (V_accumulated signal+V_FD$_1$ aliasing signal).

The subtraction processing is based on a subtraction equation given as follows.

$$V_s - V_n = (\text{V\_accumulated signal} + \text{V\_FD}_1 \text{ aliasing signal}) -$$
$$\text{V\_FD}_2 \text{ aliasing signal}$$
$$= \text{V\_accumulated signal}$$

The above subtraction equation is obtained because the following equation holds true: (V_FD$_1$ aliasing signal=V_FD$_2$ aliasing signal).

Figure 10:
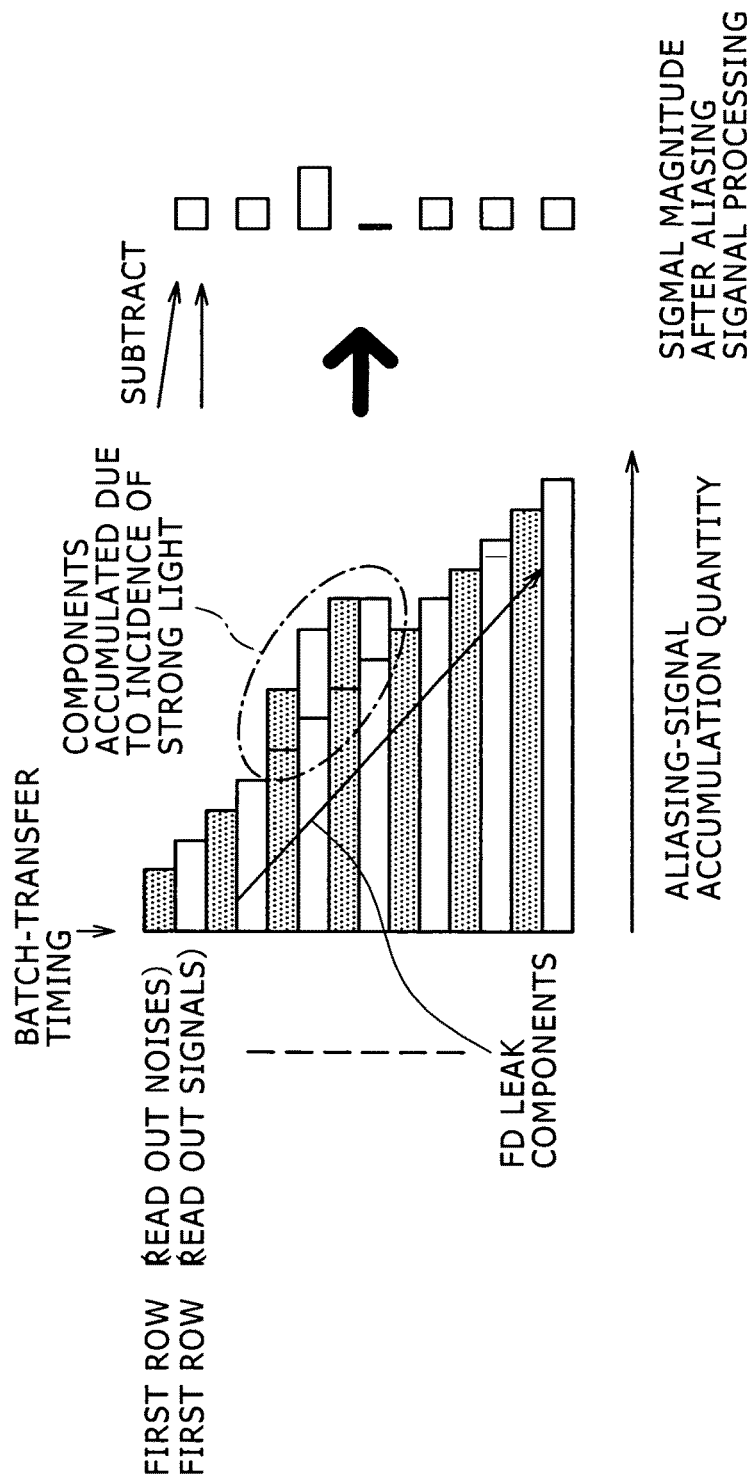
FIG. 10 is a diagram showing a relation between the electric-charge amount of the aliasing signal and the quantity of a post-subtraction signal for every pixel row being read.

FIG. 10 is a diagram showing a relation between the electric-charge amount of the aliasing signal and the quantity of a post-subtraction signal for every pixel row being read. The leak component of the electric-charge accumulation section including a floating diffusion area increases proportionally to the length of the elapsed time. As explained before, however, the accumulation times of the aliasing signal (the $V\_FD_2$ aliasing signal which is a noise signal) and the aliasing signal (the $V\_FD_1$ aliasing signal) included in the optical signal $V_s$ are made close to each other. Thus, the correlation between the $V\_FD_2$ aliasing signal and the $V\_FD_1$ aliasing signal is strong. As a result, the $V\_FD_2$ aliasing signal (or the noise signal) can be used for well correcting the optical signal $V_s$.

With regard to the noise components obtained as a result of opto-electric conversion processes carried out by electric-charge accumulation sections themselves to convert light incident to the electric-charge accumulation section into an electrical signal, the shorter the distance between the locations at which the opto-electric conversion processes are carried out by the electric-charge accumulation sections, the stronger the correlation between the noise components. In the pixel structures according to this embodiment or, to put it concretely, in the first to third pixel structures described earlier, the first electric-charge accumulation section 33 and the second electric-charge accumulation section 35 are provided in the same unit pixel 30. It is thus possible to obtain a correlation which is strong in comparison with the existing technology in which pixels for the purpose of correction are provided separately from image taking pixels. As a result, it is possible to better correct the aliasing signal without reducing the number of effective unit pixels in the aliasing-signal correction processing.

By the way, the magnitudes of the leak component and the noise component caused by the opto-electric conversion processes are generally considered to be proportional to the areas of the electric-charge accumulation sections in many cases. In the case of the typical layout shown in FIG. 5, the first electric-charge accumulation section 33 most likely generates more aliasing signals than those generated by the second electric-charge accumulation section 35. In addition, if the ratio of the sensitivity of the first electric-charge accumulation section 33 to the sensitivity of the second electric-charge accumulation section 35 is a: 1 representing relative sensitivity characteristics of the first electric-charge accumulation section 33 and the second electric-charge accumulation section 35 where notation a denotes a proportionality coefficient, in actuality, the subtraction processing block 50 is provided with a function to multiply the noise component by the proportionality coefficient a prior to the subtraction processing carried out by the subtractor 53.

Figure 11:
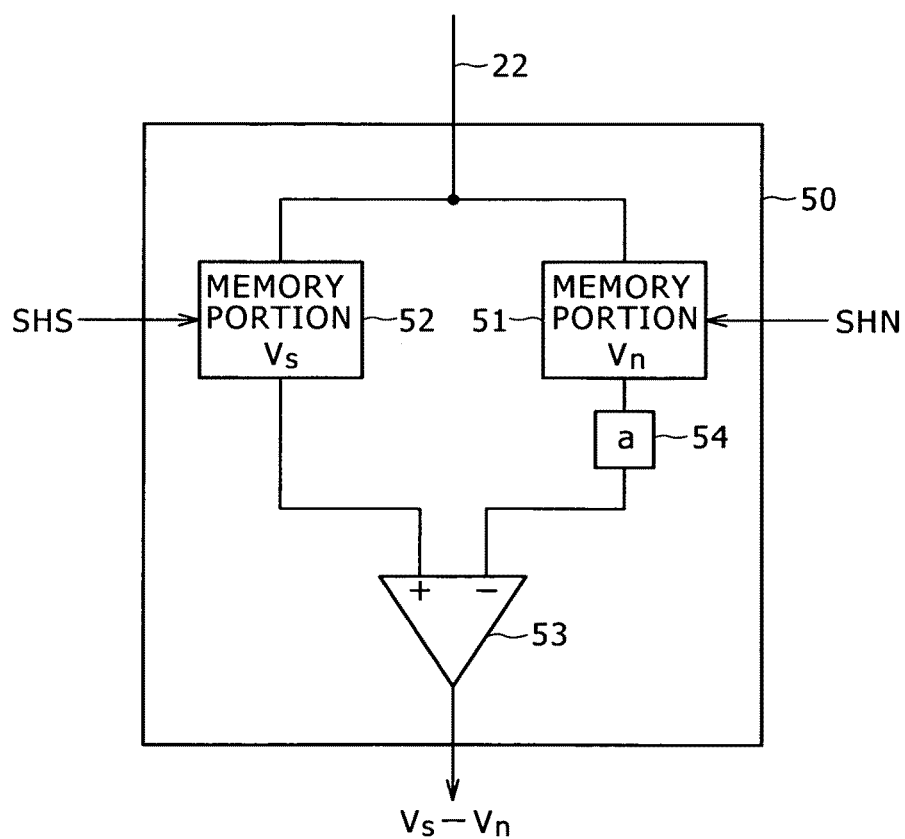
FIG. 11 is a block diagram showing another typical configuration of the subtraction processing block for carrying out processing to subtract an aliasing signal from an optical signal in the signal processing section.

To put it concretely, as shown in FIG. 11, a multiplier 54 is provided on the downstream side of the memory portion 51. The multiplier 54 multiplies the noise component $V_n$ by the proportionality coefficient a. Then, the subtractor 53 carries out processing to subtract the product (the aliasing signal ($V\_FD_2$ aliasing signal)×the proportionality coefficient a) from the optical signal $V_s$ (V_accumulated signal+$V\_FD_1$ aliasing signal). By carrying out the processing making use of the proportionality coefficient a in this way, it is possible to bring about a merit of freedom to selectively adopt, among other pixel configurations, a pixel configuration imposing a restriction that the first electric-charge accumulation section 33 and the second electric-charge accumulation section 35 must occupy areas with sizes equal to each other on the layout or a pixel configuration in which the magnitude of the noise generated by the first electric-charge accumulation section 33 and the magnitude of the noise generated by the second electric-charge accumulation section 35 are different from each other.

The proportionality coefficient a is considered to be a coefficient that can be determined in principle by the ratio of the area of the first electric-charge accumulation section 33 to the area of the second electric-charge accumulation section 35. In actuality, however, the proportionality coefficient a is found by carrying out processing based on noise components read out from the first electric-charge accumulation section 33 and the second electric-charge accumulation section 35. As an alternative, the noise components read out from the first electric-charge accumulation section 33 and the second electric-charge accumulation section 35 are evaluated and the proportionality coefficient a is found on the basis of the evaluation results. In this way, a more accurate proportionality coefficient a can be found.

Subtraction Processing Using an Up/Down Counter

Figure 12:
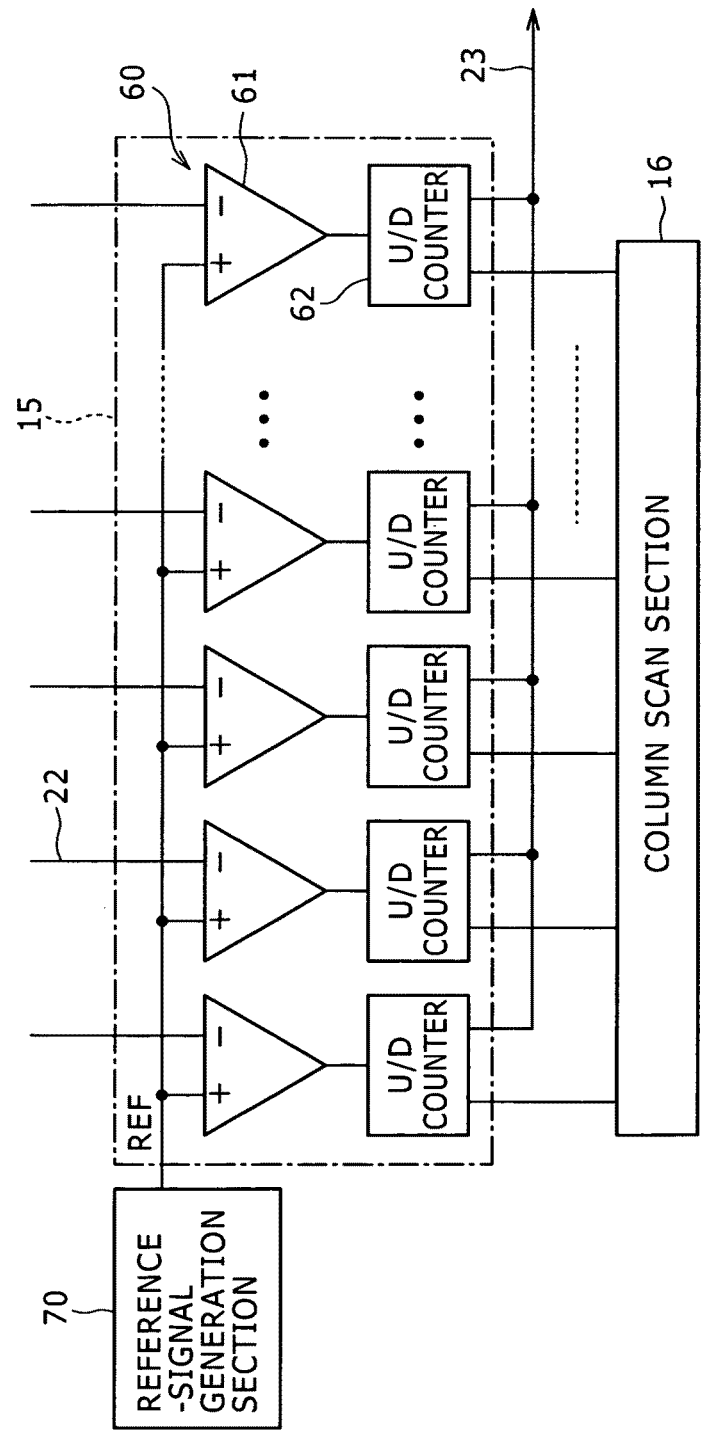
FIG. 12 is a block diagram showing a typical configuration of a column signal processing section adopting the so-called column AD conversion method to carry out the function of an AD conversion block provided in the column signal processing section.

FIG. 12 is a block diagram showing a typical configuration of a column-signal processing section 15 adopting the so-called column AD conversion method to carry out the function of an AD conversion block 60 provided in the column-signal processing section 15 for every pixel column in the pixel array section 12.

As described above, the column-signal processing section 15 adopts the column AD conversion method for carrying out an AD (Analog to Digital) conversion process of converting an analog pixel signal into a digital pixel signal for every pixel column. The column-signal processing section 15 adopting the column AD conversion method takes an AD conversion block 60, which has a circuit configuration including at least a comparator 61 and a U/D (Up/Down) counter 62, as a unit circuit. The AD conversion blocks 60 each serving as a unit circuit of the column-signal processing section 15 are laid out to form a configuration in which each of the AD conversion blocks 60 is provided for a pixel column of the pixel array section 12.

Since the column AD conversion method is adopted, the CMOS-type image sensor 10 is provided with a reference-signal generation section 70 for generating a reference signal to be supplied to the AD conversion blocks 60 employed in the column-signal processing section 15 as a signal common to the AD conversion blocks 60. This reference-signal generation section 70 is configured to employ typically a DA (digital to analog) conversion circuit for generating a reference signal REF having the so-called ramp waveform which is a slope waveform varying linearly at a gradient corresponding to a certain angle. This reference signal REF is supplied to a specific one of the two input terminals of every comparator 61 as a signal common to all pixel rows. For example, the reference signal REF is supplied to the non-inverting input terminal of every comparator 61.

An analog pixel signal conveyed by the vertical signal line 22 is supplied to the other one of the two input terminals of the comparator 61. For example, the analog pixel signal is supplied to the inverting input terminal of the comparator 61. The comparator 61 compares the analog pixel signal with the reference signal REF for every pixel column. At the same time, the U/D counter 62 starts a count operation. The U/D counter 62 is typically an U/D counter carrying out an up/down count operation synchronously with a clock signal having a constant period. The up or down direction of the count operation carried out by the U/D counter 62 is determined in accordance with control based on an instruction issued by the control section 18 employed in the CMOS-type image sensor 10 shown in FIG. 1.

When the analog pixel signal intersects with the reference signal REF, the comparator 61 inverts the polarity of a signal output. With the timing to invert the polarity of the signal output by the comparator 61, the U/D counter 62 stops its count operation. An eventual count value produced by the U/D counter 62 is the digital data (or the pixel data) representing the magnitude of the analog pixel signal being converted by the AD conversion block 60. This digital data is sequentially output to a horizontal signal line 23 through a horizontal scan switch which sequentially turns on in synchronization with the column scan operation. The horizontal scan switch itself is not shown in FIG. 12

In the AD conversion block 60 with the configuration described above, with the timing to read out the aliasing signal $V_n$ explained earlier from the unit pixel 30 as an aliasing signal (the $V\_FD_2$ aliasing signal), the control section 18 issues an instruction to the U/D counter 62 to start a down count operation. Receiving the instruction to start a down count operation, the U/D counter 62 carries out the down count operation on the aliasing signal $V_n$ synchronously with the clock signal having a constant period.

Then, with the timing to read out the optical signal $V_s$ explained earlier from the unit pixel 30 as an optical signal ($V\_accumulated\ signal+V\_FD_1$ aliasing signal), the control section 18 issues an instruction to the U/D counter 62 to start an up count operation. Receiving the instruction to start an up count operation, the U/D counter 62 carries out the up count operation on the optical signal $V_s$ synchronously with the clock signal having a constant period. In essence, the down and up count operations carried out by the U/D counter 62 is the processing to subtract the aliasing signal $V_n$ (=$V\_FD_2$ aliasing signal) from the optical signal $V_s$ (=$V\_accumulated\ signal+V\_FD_1$ aliasing signal).

As described above, by providing the column-signal processing section 15 with the U/D counter 62, the subtraction processing can be carried out by making use of the existing AD conversion block 60 without adding a special processing circuit.

It is to be noted that, if the ratio of the sensitivity of the first electric-charge accumulation section 33 to the sensitivity of the second electric-charge accumulation section 35 is a: 1 representing relative sensitivity characteristics of the first electric-charge accumulation section 33 and the second electric-charge accumulation section 35 where notation a denotes a proportionality coefficient, by applying a gain of a times to the down count operation carried out by the U/D counter 62 on the aliasing signal $V_n$, it is possible to carry out processing to multiply the noise component by the proportionality coefficient a. The process of applying a gain of a times to the down count operation carried out by the U/D counter 62 on the aliasing signal $V_n$ can be performed by typically changing the gradient of the reference signal REF having a ramp waveform in accordance with the gain of a times during the down count operation.

The first embodiment described above is a typical implementation in which the processing to subtract the aliasing signal $V_n$ (=$V\_FD_2$ aliasing signal) from the optical signal $V_s$ (=$V\_accumulated\ signal+V\_FD_1$ aliasing signal) is carried out by the column-signal processing section 15. However, the section for carrying out this subtraction processing does not have to be the column-signal processing section 15. For example, in place of the column-signal processing section 15, the output processing section 17 or a signal processing section provided externally to the semiconductor substrate 11 can also be used for carrying out this subtraction processing. This signal processing section provided externally to the semiconductor substrate 11 is shown in none of the figures.

If the output processing section 17 or a signal processing section provided externally to the semiconductor substrate 11 is used for carrying out the subtraction processing, basically, the subtraction processing is performed in the same way as the subtraction processing done by the column-signal processing section 15. To put it concretely, analog subtraction processing making use of a subtractor or digital subtraction processing making use of an up/down counter can be carried out in order to subtract the aliasing signal $V_n$ (=$V\_FD_2$ aliasing signal) from the optical signal $V_s$ (=$V\_accumulated\ signal+V\_FD_1$ aliasing signal).

2-2: Second Embodiment

Figure 13:
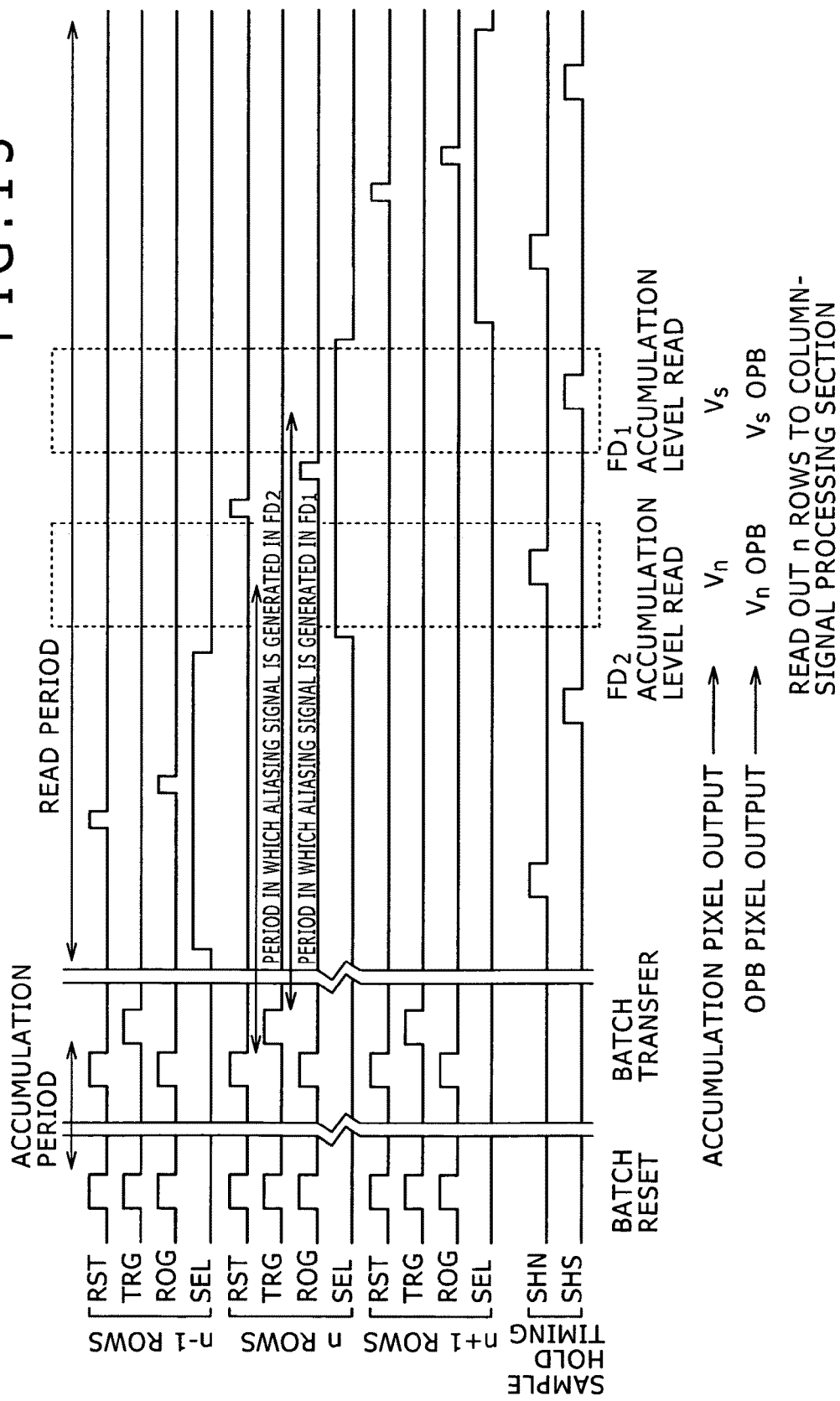
FIG. 13 shows timing charts to be referred to in explanation of a driving operation carried out by adoption of a driving method according to a second embodiment.

FIG. 13 shows timing charts referred to in the following explanation of a driving operation carried out by adoption of a driving method according to a second embodiment.

In accordance with the driving method provided by the second embodiment, if the ratio of the sensitivity of the first electric-charge accumulation section 33 to the sensitivity of the second electric-charge accumulation section 35 is a: 1 representing relative sensitivity characteristics of the first electric-charge accumulation section 33 and the second electric-charge accumulation section 35 where notation a denotes a proportionality coefficient, the aliasing signal of the second electric-charge accumulation section 35 is multiplied by the proportionality coefficient a in a single uniform way. As explained earlier, however, the aliasing signal is composed of two components, i.e., a leak component of electric charge with an amount increasing proportionally to the length of the elapsed time and a noise component generated in an opto-electric conversion process carried out by the electric-charge accumulation section itself.

For the noise component generated in an opto-electric conversion process as one of the two components, the ratio of the sensitivity of the first electric-charge accumulation section 33 to the sensitivity of the second electric-charge accumulation section 35 can be considered to have a value of a: 1 representing relative sensitivity characteristics of the first electric-charge accumulation section 33 and the second electric-charge accumulation section 35 where notation a denotes a proportionality coefficient. On the other hand, the leak component is generally generated due to a dark current caused by a structural defect. Thus, by merely carrying out processing making use of the proportionality coefficient a based on the relative sensitivity characteristics of the first electric-charge accumulation section 33 and the second electric-charge accumulation section 35 or, to be more specific, based on the relation of a: 1 representing the ratio of the sensitivity of the first electric-charge accumulation section 33 to the sensitivity of the second electric-charge accumulation section 35, there is a conceivable case of a situation in which the leak component cannot be corrected with absolute certainty.

The driving method according to the second embodiment is provided for a case in which the ratio of the sensitivity of the first electric-charge accumulation section 33 to the sensitivity of the second electric-charge accumulation section 35 is a: 1 representing the relative sensitivity characteristics of the first electric-charge accumulation section 33 and the second electric-charge accumulation section 35 and for a case in which the leak component is assumed to be dominant. In addition, in accordance with the driving method provided by the second embodiment, in order to correct an aliasing signal, which is dominated by the leak component, with more absolute certainty, information output by light-shielded unit pixels is used.

A light-shielded unit pixel has the same pixel structure as an effective unit pixel for generating a pixel signal as a signal for creating an image. The light-shielded unit pixel is placed in the so-called OPB (optical black) area which is an area optically shielded from light. For this reason, the light-shielded unit pixel is also referred to as an OPB pixel in the following description. The OPB pixels used in the second embodiment are provided in the peripheries of the pixel array section in which effective unit pixels are provided. In particular, the OPB pixels used in the second embodiment are provided on both the horizontal-direction sides of the pixel array section.

In the case of the driving method according to the first embodiment, since the aliasing signal is corrected by performing processing on the signals $V_n$ and $V_s$ output by one effective unit pixel, the column scan section 16 is capable of carrying out the processing. In the case of the driving method according to the second embodiment, on the other hand, in addition to the signals $V_n$ and $V_s$ output by one effective unit pixel, the processing performed to correct the aliasing signal also makes use of information output by an OPB pixel which is located on a pixel column different from that of the effective unit pixel.

Thus, in the case of the driving method according to the second embodiment, the processing to correct the aliasing signal is not carried out by the column scan section 16, but carried out by a signal processing section provided externally to the semiconductor substrate 11. In the following description, the signal processing section provided externally to the semiconductor substrate 11 is referred to simply as an external signal processing section. Typical examples of the external signal processing section include a DSP (Digital Signal Processing) circuit 103 employed by an image taking apparatus 100 to be described later by referring to FIG. 18 and a signal processing section corresponding to a processing apparatus provided separately.

In accordance with the driving method provided by the second embodiment, the operation to read out the aliasing signal $V_n$ of the second electric-charge accumulation section 35 also denoted by reference symbol $FD_2$ from the unit pixel 30 employing the second electric-charge accumulation section 35 and, then, the optical signal $V_s$ generated by the second electric-charge accumulation section 35 as a signal including the aliasing signal of the first electric-charge accumulation section 33 also denoted by reference symbol $FD_1$ from the unit pixel 30 is carried out in the same way as the driving method provided by the first embodiment. The fact that the operation is carried out in the second embodiment in the same way as the driving method provided by the first embodiment also becomes obvious if the reader compares the timing charts shown in FIG. 8 with the timing charts shown in FIG. 13.

It is to be noted that the sampling signals SHN and SHL shown in the timing charts of FIG. 13 are used by the external signal processing section to sample the aliasing signal $V_n$ and the optical signal $V_s$ respectively.

In accordance with the driving method provided by the second embodiment, in addition to the outputs of the effective unit pixel, outputs $V_n\_OPB$ and $V_s\_OPB$ which are generated by the OPB pixel are also used as well. As described before, the outputs of the effective unit pixel are the aliasing signal $V_n$ and the optical signal $V_s$. The output $V_n\_OPB$ is the aliasing signal of the second electric-charge accumulation section 35 employed in the OPB pixel. The output $V_n\_OPB$ corresponds to the aliasing signal $V_n$ output by the second electric-charge accumulation section 35 employed in the effective unit pixel. On the other hand, the output $V_s\_OPB$ is the aliasing signal of the first electric-charge accumulation section 33 employed in the OPB pixel. The output $V_s\_OPB$ corresponds to the optical signal $V_s$ output by the first electric-charge accumulation section 33 employed in the effective unit pixel.

The signals described above are defined in the following summary of equations:

$V_n = V\_FD_2\_\text{leak component} + V\_FD_2\_\text{post-exposure opto-electrically converted component}$ $V_s = V\_\text{accumulated signal} + V\_FD_1\_\text{leak component} + V\_FD_1\_\text{post-exposure opto-electrically converted component}$ $V_n\_OPB = V\_FD_2\_\text{leak component}$ $V_s\_OPB = V\_FD_1\_\text{leak component}$ A processing formula used in the external signal processing section is represented by equations given as follows:

$$(V_s - V_s\_OPB) - (V_n - V_n\_OPB) \times a =$$
$$V\_\text{accumulated signal} + V\_FD_1\_\text{post-exposure opto-electrically}$$
$$\text{converted component} - V\_FD_2\_\text{post-exposure opto-}$$
$$\text{electrically converted component} \times a = V\_\text{accumulated signal}$$

The above processing formula is obtained because the following equation holds true: $V\_FD_1\_\text{post-exposure opto-electrically converted component} = V\_FD_2\_\text{post-exposure opto-electrically converted component} \times a$.

As explained earlier, the processing based on the processing formula given above is processing which also makes use of information output by an OPB pixel which is located on a pixel column different from that of the effective unit pixel. Thus, the processing cannot be carried out by the column-signal processing section 15. For this reason, the aliasing signal $V_n$ (for several horizontal effective unit pixels), the optical signal $V_s$ (for several horizontal effective unit pixels), the output $V_n\_OPB$ (for several OPB pixels per row to several tens of OPB pixels per row) and the output $V_s\_OPB$ (for several OPB pixels per row to several tens of OPB pixels per row) are output to the external signal processing section provided externally to the semiconductor substrate 11 to serve as a section corresponding to a processing apparatus for carrying out the processing based on the processing formula given above.

As described above, the correction processing is carried out by making use of the output $V_n\_OPB$ and the output $V_s\_OPB$, which are generated by the OPB pixel, in addition to the signals $V_n$ and $V_s$ output by the effective unit pixel. Thus, with more absolute certainty, it is possible to correct an aliasing signal dominated by the leak component which is generally generated due to a dark current caused by a structural defect.

2-3: Third Embodiment

Figure 14:
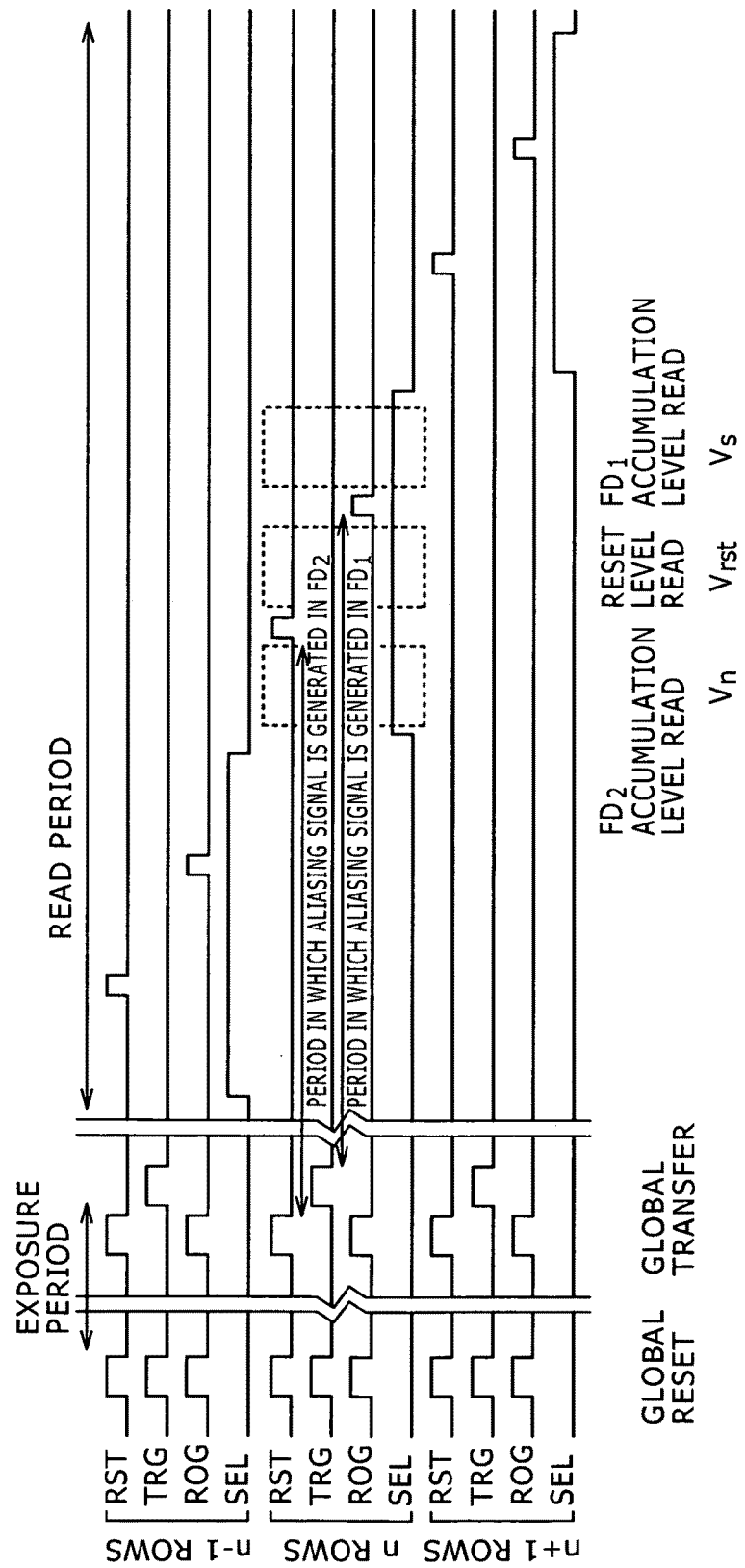
FIG. 14 shows timing charts to be referred to in explanation of a driving operation carried out by adoption of a driving method according to a third embodiment.

FIG. 14 shows timing charts referred to in the following explanation of a driving operation carried out by adoption of a driving method according to a third embodiment.

The driving methods according to the first and second embodiments are each a driving method provided for correction of an aliasing signal generated in the first electric-charge accumulation section 33. On the other hand, the driving method according to the third embodiment is a driving method provided for correction of not only an aliasing signal generated in the first electric-charge accumulation section 33, but also the so-called kTC noise which is a fixed-pattern noise of the unit pixel. To put it concretely, the kTC noise is a noise which is generated when the first electric-charge accumulation section 33 is reset. Processing to correct the kTC noise is typically carried out by a commonly known CDS (correlation double sampling) circuit provided in the column-signal processing section 15.

As shown in the timing charts of FIG. 14, operations ending with the operation to output the aliasing signal $V_n$ representing the amount of electric charge accumulated in the second electric-charge accumulation section 35 also denoted by reference symbol $FD_2$ as an aliasing signal (the $V\_FD_2$ aliasing signal) of the second electric-charge accumulation section 35 are carried out in the same way as the driving method provided by the first embodiment. For this reason, the following description explains subsequent operations carried out thereafter.

After the operation to output the aliasing signal $V_n$ representing the amount of electric charge accumulated in the second electric-charge accumulation section 35 has been carried out, the reset pulse RST set at a high level is supplied to the reset transistor 36 in order to reset the second electric-charge accumulation section 35. Then, a signal which is generated by the second electric-charge accumulation section 35 when the second electric-charge accumulation section 35 has been reset is output as a reset level $V_{rst}$ of the second electric-charge accumulation section 35.

Later on, the read pulse ROG set at a high level is supplied to the read transistor 34 in order to transfer electric charge from the first electric-charge accumulation section 33 to the second electric-charge accumulation section 35. The electric charge transferred from the first electric-charge accumulation section 33 is electric charge obtained as a result of superposing aliasing signal components on an optical signal representing signal electric charge accumulated in the photodiode 31. Then, the optical signal $V_s$ representing the amount of electric charge accumulated in the second electric-charge accumulation section 35 is output as an optical signal (V_accumulated signal+$V\_FD_1$ aliasing signal) including an aliasing signal of the first electric-charge accumulation section 33 also denoted by reference symbol $FD_1$.

In this case, the aliasing signal $V_n$, the reset level $V_{rst}$ and the optical signal $V_s$ are expressed by the following three equations respectively:

$$V_n = V\_kTC_1 + V\_FD_2 \text{ aliasing signal}$$

$$V_{rst} = V\_kTC_2$$

$$V_s = V\_\text{accumulated signal} + V\_kTC_2 + V\_FD_1 \text{ aliasing signal}$$

It is to be noted that, since $V\_kTC_1$ and $V\_kTC_2$ have different reset timings, there is no correlation between $V\_kTC_1$ and $V\_kTC_2$.

If the $V\_FD_1$ and $V\_FD_2$ aliasing signals have the same sensitivity characteristic, the subtraction processing carried out by the column-signal processing section 15 can be expressed by the following processing formula:

$$V_s - V_n - V_{rst} = (V\_\text{accumulated signal} + V\_kTC_2 + V\_FD_1 \text{ aliasing signal}) - (V\_kTC_1 + V\_FD_2 \text{ aliasing signal}) - V\_kTC_2 = V\_\text{accumulated signal} - V\_kTC_1$$

The above processing formula is obtained because the following equation holds true: $V\_FD_1$ aliasing signal=$V\_FD_2$ aliasing signal.

In the case of the driving methods according to the first and second embodiments, the correction of the kTC noise is not taken into consideration. Thus, the kTC noise is added to the V_accumulated signal in two read operations, i.e. the operation to read out the aliasing signal $V_n$ and the operation to read out the optical signal $V_s$. In the case of the driving method according to the third embodiment, on the other hand, the so-called CDS (correlation double sampling) operation is carried out in order to reduce the kTC noise for one of the two read operations.

In the description given so far for the driving method according to the third embodiment, it is assumed that the column-signal processing section 15 carries out the subtraction processing by making use of the subtractor employed in the subtraction processing block 50 shown in FIG. 9. By making use of the U/D counter 62 employed in the AD conversion block 60 shown in FIG. 12, the subtraction processing can also be carried out as well. To put it concretely, in this case, the U/D counter 62 carries out a down count operation on the aliasing signal $V_n$ and the reset level $V_{rst}$, but an up count operation on the optical signal $V_s$.

2-4: Fourth Embodiment

Figure 15:
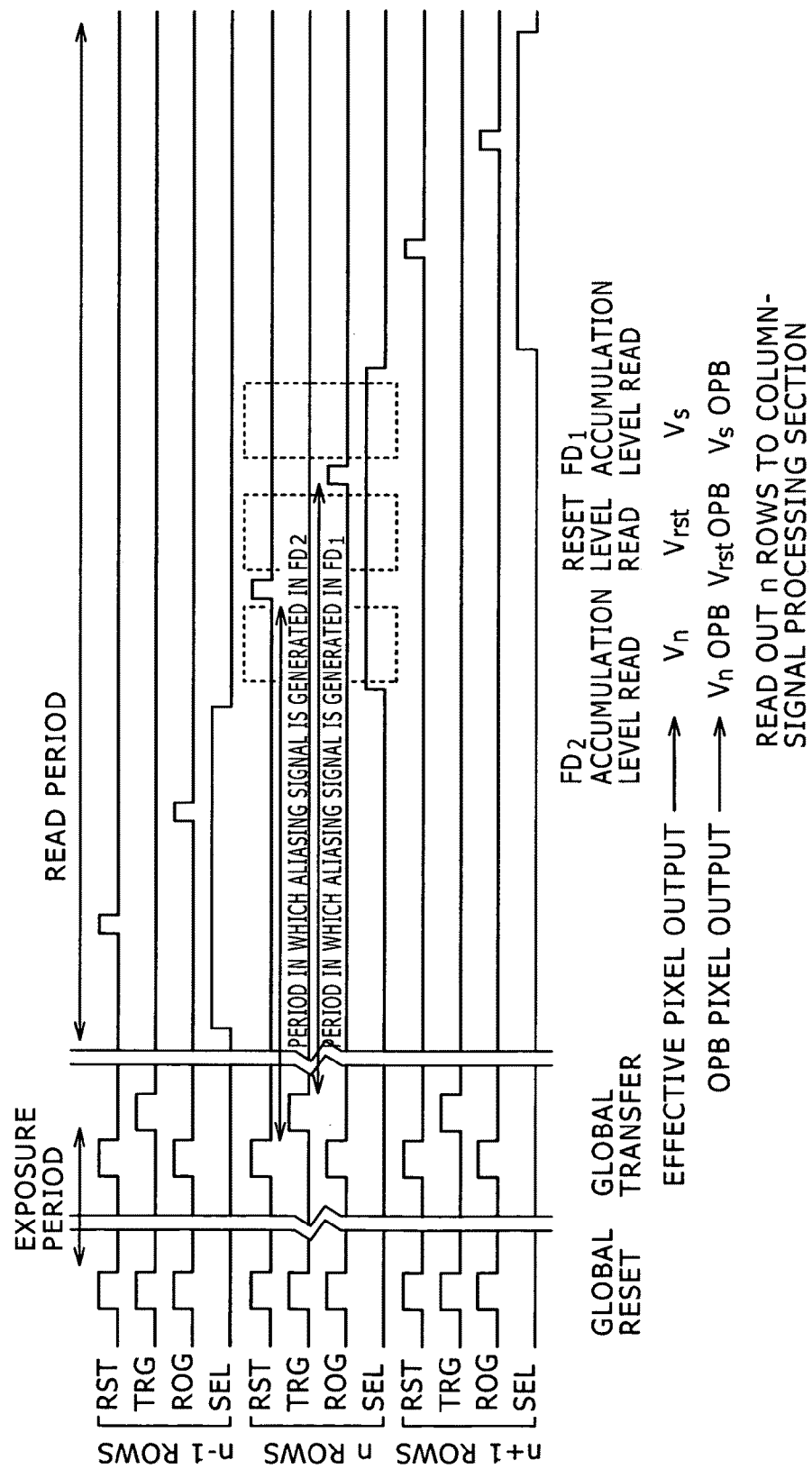
FIG. 15 shows timing charts to be referred to in explanation of a driving operation carried out by adoption of a driving method according to a fourth embodiment.

FIG. 15 shows timing charts referred to in the following explanation of a driving operation carried out by adoption of a driving method according to a fourth embodiment.

The driving method according to the fourth embodiment is a combination of the driving method according to the third embodiment and the driving method according to the second embodiment. As explained before, in accordance with the driving method provided by the third embodiment, the correction of the kTC noise is taken into consideration whereas, in accordance with the driving method provided by the second embodiment, information output by the OPB pixels is used. The processing adopting the driving method according to the fourth embodiment can be carried out by an external signal processing section in the same way as the driving method according to the second embodiment.

In accordance with the driving method provided by the fourth embodiment, operations to read out the aliasing signal $V_n$, the reset level $V_{rst}$ and the optical signal $V_s$ are carried out in the same way as the driving method provided by the third embodiment. The fact that the operations to read out the aliasing signal $V_n$, the reset level $V_{rst}$ and the optical signal $V_s$ are carried out in accordance with the driving method provided by the fourth embodiment in the same way as the driving method provided by the third embodiment also becomes obvious if the reader compares the timing charts shown in FIG. 14 with the timing charts shown in FIG. 15. In accordance with the driving method provided by the fourth embodiment, in addition to the aliasing signal $V_n$, the reset level $V_{rst}$ and the optical signal $V_s$ which are output by the effective unit pixel, outputs $V_{n\_}$OPB, $V_{rst\_}$OPB and $V_{s\_}$OPB which are generated by the OPB pixel are also used as well.

The output $V_{n\_}$OPB is the aliasing signal of the second electric-charge accumulation section 35 employed in the OPB pixel. The output $V_{n\_}$OPB corresponds to the aliasing signal $V_n$ output by the second electric-charge accumulation section 35 employed in the effective unit pixel. The output $V_{rst\_}$OPB is the reset level $V_{rst}$ of the second electric-charge accumulation section 35 employed in the OPB pixel. The output $V_{rst\_}$OPB corresponds to the reset level $V_{rst}$ output by the second electric-charge accumulation section 35 employed in the effective unit pixel. The output $V_{s\_}$OPB is the aliasing signal of the first electric-charge accumulation section 33 employed in the OPB pixel. The output $V_{s\_}$OPB corresponds to the aliasing signal $V_s$ output by the first electric-charge accumulation section 33 employed in the effective unit pixel.

In this case, the aliasing signal $V_n$, the reset level $V_{rst}$, the optical signal $V_s$ the aliasing signal $V_{n\_}$OPB, the reset level $V_{rst\_}$OPB and the aliasing signal $V_{s\_}$OPB are expressed by the following six equations respectively:

$$V_n = V\_FD_2\_\text{leak component} + V\_FD_2\_\text{post-exposure photo-electrically converted component} + V\_kTC_1$$

$$V_{rst} = V\_kTC_2$$

$$V_s = V\_\text{accumulated signal} + V\_FD_1\_\text{leak component} + V\_FD_1\_\text{post-exposure photo-electrically converted component} + V\_kTC_2$$

$$V_{n\_}\text{OPB} = V\_FD_2\_\text{leak component} + V\_kTC_1$$

$$V_{rst\_}\text{OPB} = V\_kTC_2$$

$$V_{s\_}\text{OPB} = V\_FD_1\_\text{leak component} + V\_kTC_2$$

For a case in which the ratio of the sensitivity of the first electric-charge accumulation section 33 to the sensitivity of the second electric-charge accumulation section 35 is a: 1 representing the relative sensitivity characteristics of the first electric-charge accumulation section 33 and the second electric-charge accumulation section 35 and, in addition, the leak component is assumed to be dominant, the processing formula for the subtraction processing is expressed by the following equation:

$$(V_s + V_{s\_}\text{OPB} - V_{rst} - V_{rst\_}\text{OPB}) - (V_n - V_{n\_}\text{OPB}) \times a = V\_\text{accumulated signal} - V\_kTC_2 \times a$$

The above processing formula is obtained because the following equation holds true: $V\_FD_1\_\text{post-exposure opto-electrically converted component} = V\_FD_2\_\text{post-exposure opto-electrically converted component} \times a$.

The processing described above can be carried out by an external signal processing section in the same way as the driving method according to the second embodiment. However, the value of the expression $(V_s - V_{s\_}\text{OPB} - V_{rst\_}\text{OPB} - V_{rst})$ used in the above processing formula can also be computed by the column-signal processing section 15. To put it concretely, in the subtraction processing carried out by the U/D counter 62 employed in the AD conversion block 60 shown in FIG. 12, the U/D counter 62 carries out a down count operation on the reset level $V_{rst}$, but an up count operation on the optical signal $V_s$ for an effective unit pixel on every pixel column whereas, for an OPB pixel on a pixel column, the U/D counter 62 carries out a down count operation on the reset level $V_{rst\_}$OPB, but an up count operation on the signal $V_{s\_}$OPB.

In accordance with the driving method provided by the fourth embodiment described above, it is possible to obtain the operation effects exhibited by the driving method according to the second embodiment as well as the operation effects exhibited by the driving method according to the third embodiment. That is to say, in accordance with the driving method provided by the fourth embodiment, it is possible to reduce the kTC noise by carrying out the CDS operation while correcting an aliasing signal, which is dominated by the leak component generally generated due to a dark current caused by a structural defect, with more absolute certainty.

3: Modified Versions

Figure 16:
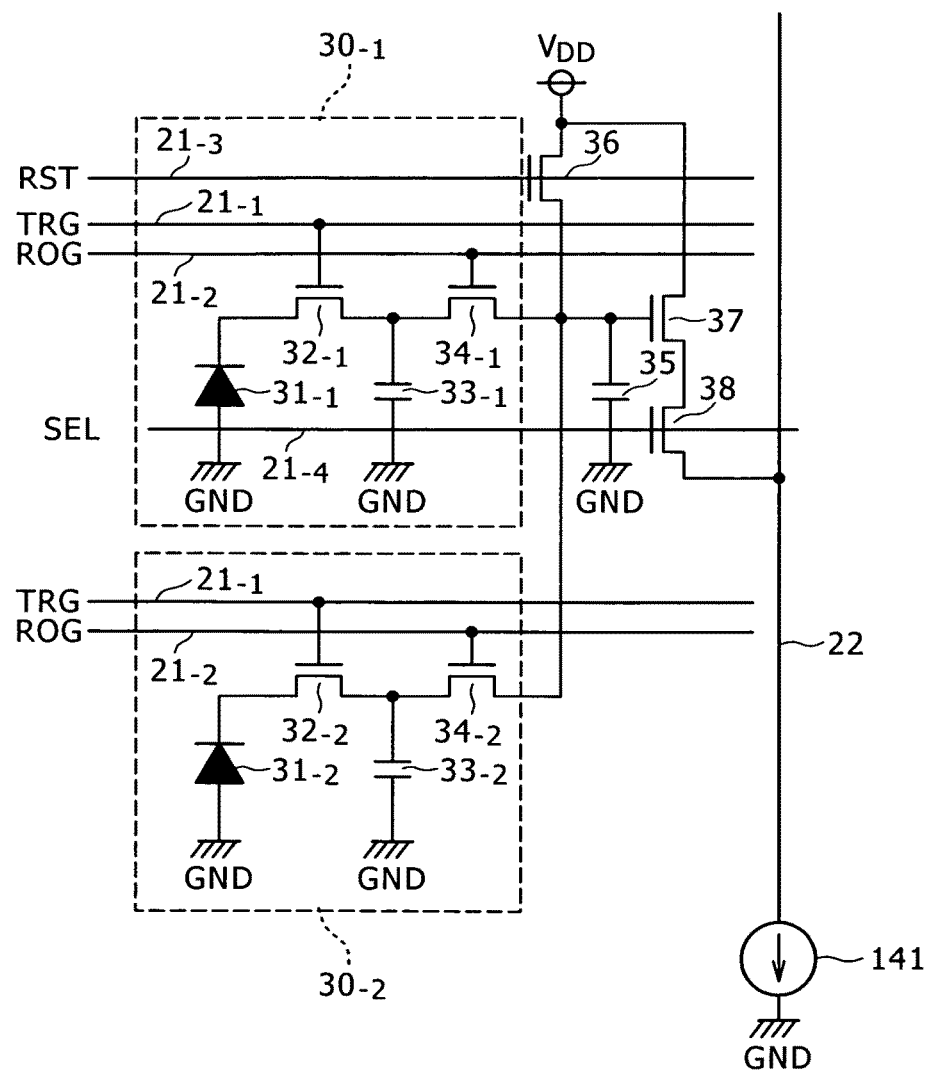
FIG. 16 is a diagram showing a typical pixel circuit according to a modified version of the embodiment.

FIG. 16 is a diagram showing a typical pixel circuit according to a modified version of the main embodiment. In the typical pixel circuit diagram of FIG. 16, components identical with their counterparts employed in the pixel circuit shown in FIG. 2 are denoted by the same reference numerals and the same reference symbols as the counterparts.

As shown in FIG. 16, the pixel circuit according to the modified version is configured to typically employ two pixels $30_{-1}$ and $30_{-2}$ vertically adjacent to each other on the same pixel column and other pixel-circuit elements shared by the pixels $30_{-1}$ and $30_{-2}$ as elements composing a pixel-circuit portion common to the pixels $30_{-1}$ and $30_{-2}$. As an example, in the pixel circuit according to the modified version, the second electric-charge accumulation section 35, the reset transistor 36, the amplification transistor 37 and the select transistor 38 are the common pixel-circuit elements shared by the two pixels $30_{-1}$ and $30_{-2}$ which are vertically adjacent to each other on the same pixel column.

By adoption of a circuit configuration including pixel-circuit elements common to a plurality of pixels adjacent to each other as described above, the solid-state image taking apparatus offers a merit that the area occupied by the common pixel-circuit elements other than the photodiode 31 serving as an opto-electric conversion section per pixel can be reduced. In the typical example shown in FIG. 16, the common pixel-circuit elements composing a circuit-pixel portion of pixels are shared by the two pixels $30_{-1}$ and $30_{-2}$ vertically adjacent to each other on the same pixel column.

In this case, however, the pixels sharing the common pixel pixel-circuit elements composing a circuit-pixel portion of the pixels do not have to be a combination of the two pixels $30_{-1}$ and $30_{-2}$ vertically adjacent to each other on the same pixel column. For example, the pixels sharing the common pixel pixel-circuit elements composing a circuit-pixel portion of the pixels can also be a combination of three pixels vertically adjacent to each other on the same pixel column. As an alternative, the pixels sharing the common pixel pixel-circuit elements composing a circuit-pixel portion of the pixels can also be a combination of four or more pixels adjacent to each other. If the combination of pixels sharing the common circuit elements composing a circuit-pixel portion of the pixels is a combination of pixels vertically adjacent to each other on the same pixel column, however, the timings to read out signals from the pixels can be controlled with ease in comparison with other combinations.

The driving methods according to the first to fourth embodiments described above can be applied also to a solid-state image taking apparatus adopting a circuit configuration including a plurality of pixels sharing common circuit elements composing a circuit-pixel portion of the pixels. Thus, it is possible to correct the aliasing signal without reducing the number of effective pixels. As a result, it is possible to produce an excellent image having simultaneity of accumulation periods of all individual pixels. In addition, it is also possible to obtain a resolution commensurate with the number of effective pixels included in the CMOS-type image sensor 10.

Figure 17:
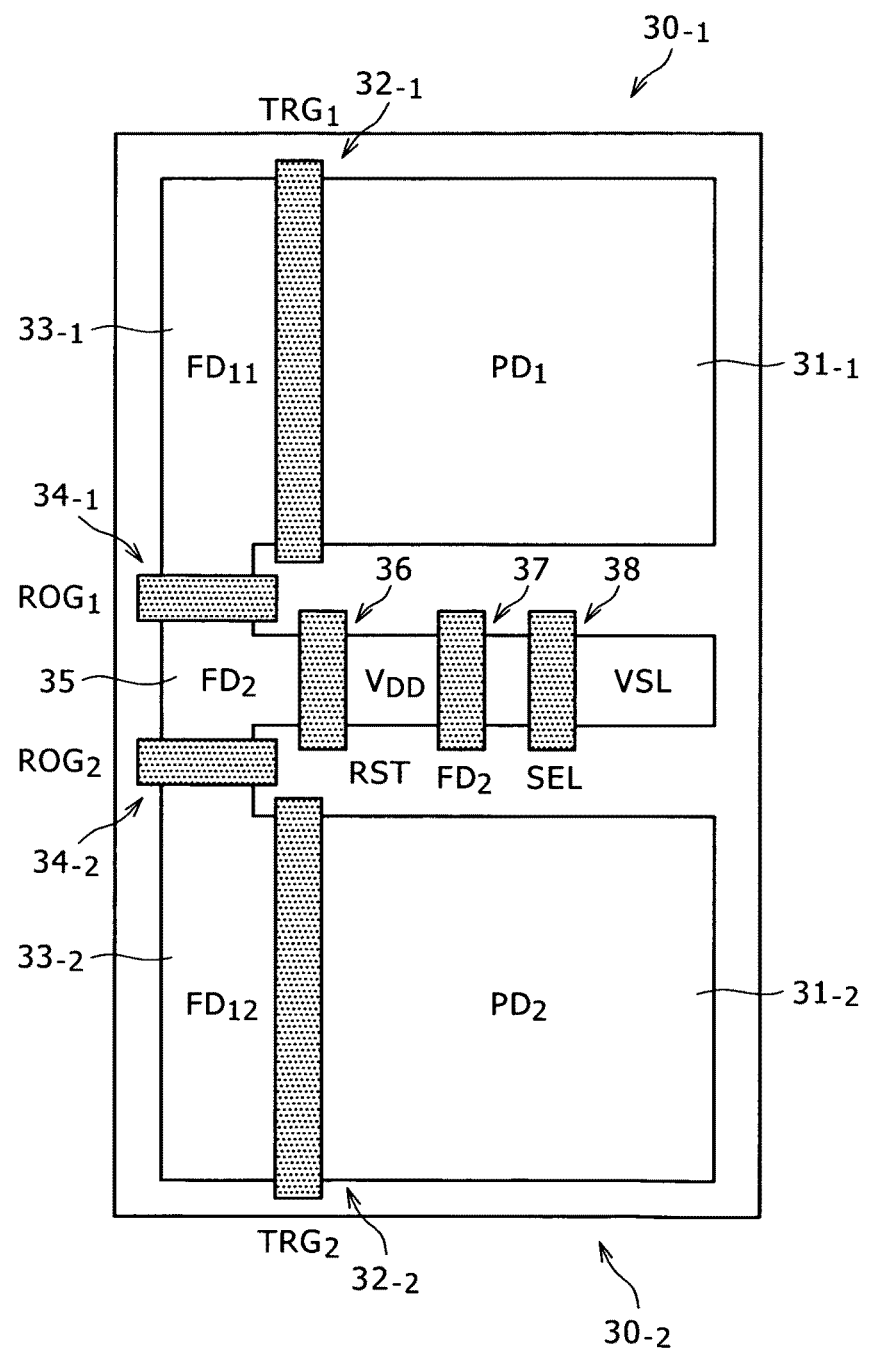
FIG. 17 is a diagram showing a typical layout structure for a configuration in which two pixels vertically adjacent to each other on the same pixel column share common circuit elements composing a circuit-pixel portion of the pixels.

FIG. 17 is a diagram showing a typical layout structure for a configuration in which the two pixels $30_{-1}$ and $30_{-2}$ vertically adjacent to each other on the same pixel column share common circuit elements composing a circuit-pixel portion of the pixels $30_{-1}$ and $30_{-2}$. The layout structure has a configuration in which the first electric-charge accumulation section $33_{-1}$ also denoted by reference numeral $FD_{11}$ to serve as the first electric-charge accumulation section 33 of the pixel $30_{-1}$ and the first electric-charge accumulation section $33_{-2}$ also denoted by reference numeral $FD_{12}$ to serve as the first electric-charge accumulation section 33 of the pixel $30_{-2}$ are placed at locations sandwiching the second electric-charge accumulation section 35 also denoted by reference numeral $FD_2$ to serve as the second electric-charge accumulation section 35 shared by the two pixels $30_{-1}$ and $30_{-2}$. In particular, the distance from the first electric-charge accumulation section $33_{-1}$ to the second electric-charge accumulation section 35 is equal to the distance from the first electric-charge accumulation section $33_{-2}$ to the second electric-charge accumulation section 35.

Since the first electric-charge accumulation section $33_{-1}$ also denoted by reference numeral $FD_{11}$ to serve as the first electric-charge accumulation section 33 of the pixel $30_{-1}$ and the first electric-charge accumulation section $33_{-2}$ also denoted by reference numeral $FD_{12}$ to serve as the first electric-charge accumulation section 33 of the pixel $30_{-2}$ sandwich the second electric-charge accumulation section 35 also denoted by reference numeral $FD_2$ to serve as the second electric-charge accumulation section 35 shared by the two pixels $30_{-1}$ and $30_{-2}$ and, in addition, the distance from the first electric-charge accumulation section $33_{-1}$ to the second electric-charge accumulation section 35 is equal to the distance from the first electric-charge accumulation section $33_{-2}$ to the second electric-charge accumulation section 35, the correlation between the first electric-charge accumulation section $33_{-1}$ and the second electric-charge accumulation section 35 can be set to approximately match the correlation between the first electric-charge accumulation section $33_{-2}$ and the second electric-charge accumulation section 35. That is to say, the correlation between the first electric-charge accumulation section $33_{-1}$ and the second electric-charge accumulation section 35 can be set at a value approximately equal to the correlation between the first electric-charge accumulation section $33_{-2}$ and the second electric-charge accumulation section 35.

By setting the correlation between the first electric-charge accumulation section $33_{-1}$ and the second electric-charge accumulation section 35 to match the correlation between the first electric-charge accumulation section $33_{-2}$ and the second electric-charge accumulation section 35 as described above, even in the case of a configuration in which the two pixels $30_{-1}$ and $30_{-2}$ vertically adjacent to each other on the same pixel column share common circuit elements composing a circuit-pixel portion of the pixels $30_{-1}$ and $30_{-2}$, the processing to correct the aliasing signal can be carried out with more absolute certainty.

The modified version described above as a modified version of the main embodiment is typically applied to a CMOS image sensor having a matrix of two-dimensionally laid out unit pixels each used for detecting signal electric charge representing the quantity of visible light as a physical quantity. It is to be noted, however, that implementations of the present invention are by no means limited to the modified version. That is to say, the present invention can be applied generally to any solid-state image taking apparatus as far as the solid-state image taking apparatus adopts the X-Y addressing method and is capable of implementing a global exposure mechanism (or a global shutter) by making use of two electric-charge accumulation sections, i.e., the first electric-charge accumulation section 33 and the second electric-charge accumulation section 35, in every unit pixel.

In addition, applications of the present invention are by no means limited to the application to a solid-state image taking apparatus for taking an image by detecting a distribution of the quantities of incident visible light. That is to say, the present invention can also be applied generally to a solid-state image taking apparatus for taking an image by detecting a distribution of the quantities of incident infrared rays, incident X rays, incident particles or the like.

It is to be noted that the solid-state image taking apparatus according to the present invention can be created in the form of one chip or in the form of a module made by putting together the image taking section and the signal processing section or the optical system in a package having an image taking function.

4: Electronic Apparatus

The present invention can be applied to not only a solid-state image taking apparatus, but also electronic apparatus such as an image taking apparatus provided with an image acquisition section (or an opto-electric conversion section). The electronic apparatus include an image taking apparatus functioning as a camera system and a mobile apparatus having an image taking function. Typical examples of the camera system are a digital still camera and a video camera. On the other hand, the mobile apparatus having an image taking function include a hand-held phone and a PDA (Personal Digital Assistant). In addition, the electronic apparatus to which the present invention is applied also include a photographing apparatus employing a solid-state image taking apparatus to serve as its image acquisition section (or image reading section). It is to be noted that, in general, if the solid-state image taking apparatus according to the present invention is created in the form of a module, the module is mounted on the electronic apparatus as a camera module which serves as an image taking apparatus.

Image Taking Apparatus

Figure 18:
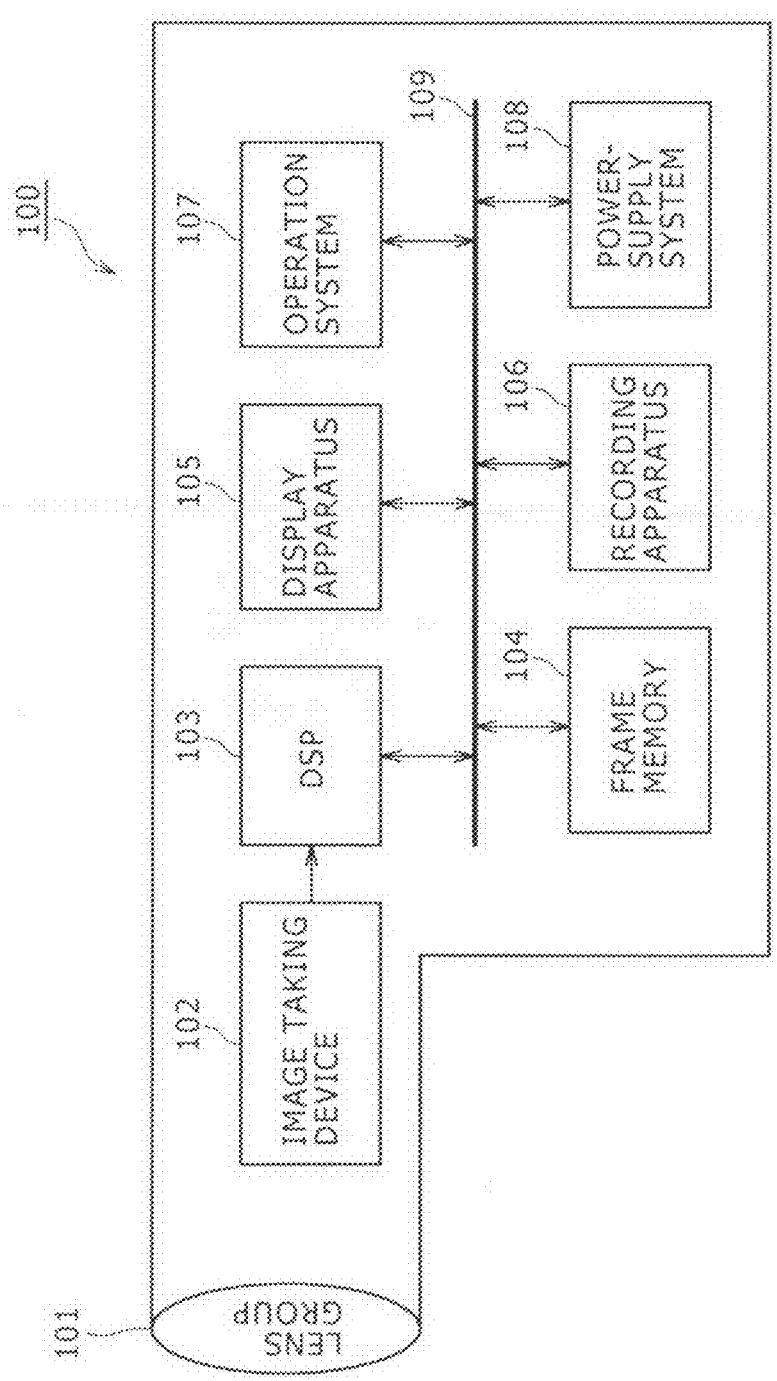
FIG. 18 is a block diagram showing a typical configuration of an image taking apparatus functioning as a typical electronic apparatus according to the embodiment of the present invention.

FIG. 18 is a block diagram showing a typical configuration of an image taking apparatus 100 functioning as a typical electronic apparatus according to the present invention. As shown in FIG. 18, the image taking apparatus 100 according to the present invention employs an optical system, an image taking device 102, a DSP circuit 103, a frame memory 104, a display apparatus 105, a recording apparatus 106, an operation system 107 and a power-supply system 108. The optical system includes a lens group 101 whereas the DSP circuit 103 functions as a camera-signal processing section. In addition, the DSP circuit 103, the frame memory 104, the display apparatus 105, the recording apparatus 106, the operation system 107 and the power-supply system 108 are connected to each other by a bus line 109.

The lens group 101 receives incident light (also referred to as image light) from an image taking object and creates an image on the image taking surface of the image taking device 102 on the basis of the light. The image taking device 102 converts the quantity of the incident light serving as a basis for creating the image on the image taking surface of the image taking device 102 into an electrical signal for every pixel and outputs the electrical signal to the DSP circuit 103 as a pixel signal.

The display apparatus 105 is a panel-type display apparatus such as liquid-crystal display apparatus or an organic EL (Electro Luminescence) display apparatus. The display apparatus 105 displays a moving or standstill image created on the image taking surface of the image taking device 102. The frame memory 106 records the moving or standstill image created on the image taking surface of the image taking device 102 on a recording medium such as a video tape or a DVD (Digital Versatile Disk).

In accordance with an operation carried out by the user on the operation system 107, the operation system 107 issues an operation instruction to carry out one of a variety of functions provided for the image taking apparatus 100. The power-supply system 108 generates operation power at a variety of levels and supplies the power to the frame memory 106, the display apparatus 105, the recording apparatus 106 and the operation system 107 at the levels proper for these power recipients.

The image taking apparatus 100 can be used as a video camera or a digital still camera. In addition, the image taking apparatus 100 can also be used as a camera module for a mobile apparatus such as a hand-held phone. On top of that, it is possible to employ the CMOS image sensor 10 according to the main embodiment described before or the modified versions explained earlier in the image taking apparatus 100 to serve as the image taking device 102.

In accordance with the CMOS image sensor 10 implemented by the main embodiment described before or the modified versions explained earlier, aliasing signals can be corrected without reducing the number of effective pixels. Thus, by employing the CMOS image sensor 10 as the image taking device 102, it is possible to produce an excellent image having simultaneity of accumulation periods of all individual pixels. In addition, it is also possible to obtain a resolution commensurate with the number of effective pixels included in the CMOS-type image sensor 10.

The present application contains subject matter related to that disclosed in Japanese Priority Patent Application JP 2010-054140 filed with the Japan Patent Office on Mar. 11, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image taking apparatus, comprising:
   a pixel array section including unit pixels laid out two-dimensionally to form a matrix, wherein each of said unit pixels comprises:
      an opto-electric conversion device configured to convert incident light into signal electric charge and accumulate said signal electric charge;
      a transfer transistor configured to transfer said signal electric charge from said opto-electric conversion device to a first electric-charge accumulation section configured to hold said signal electric charge transferred by said transfer transistor;
      a read transistor configured to read out said signal electric charge held in said first electric-charge accumulation section and output said signal electric charge to a second electric charge accumulation section configured to hold said signal electric charge read out by said read transistor;
      a reset transistor configured to reset said second electric-charge accumulation section; and
      an amplification transistor configured to output an electrical signal representing said signal electric charge held in said second electric-charge accumulation section;
   a driving section configured to drive said second electric-charge accumulation section from which a second aliasing signal component corresponding to a first aliasing signal component generated in said first electric-charge accumulation section during a period of holding said signal charge in said first electric-charge accumulation section is obtained; and
   a correction section configured to correct a signal representing said signal electric charge held in said first electric-charge accumulation section based on said second aliasing signal component,
   wherein said driving section is configured to drive said amplification transistor to output a first signal level of said second electric-charge accumulation section, and drive said amplification transistor to output a second signal level of said second electric-charge accumulation section after transferring said signal electric charge held in said first electric charge accumulation section;
   wherein said correction section subtracts a product of said first signal level and a predetermined coefficient from said second signal level.

2. The solid-state image taking apparatus according to claim 1, wherein:
   for each of said unit pixels said driving section resets said first electric-charge accumulation section as well as said second electric-charge accumulation section and, then, drives said transfer transistor to transfer signal electric charge accumulated in said opto-electric conversion device to said first electric-charge accumulation section in a batch transfer operation; and
   in a subsequent row-after-row read operation, said driving section drives said read transistor to transfer signal electric charge held in said first electric-charge accumulation section to said second electric charge accumulation section before again driving said amplification transistor to output said second signal level of said second electric-charge accumulation section.

3. The solid-state image taking apparatus according to claim 1, wherein said predetermined coefficient is set in advance based on a ratio of an area of said first electric charge accumulation section to an area of said second electric-charge accumulation section.

4. The solid-state image taking apparatus according to claim 1, wherein:
   said first signal level and said second signal level are output by an effective pixel to generate a pixel signal for creating an image; and
   said correction section subtracts a first signal level and a second signal level output by a light-shielded pixel provided on a periphery of said pixel array section and shielded from light, from said first signal level and said second signal level respectively output by said effective pixel.

5. The solid-state image taking apparatus according to claim 4, wherein said correction section is configured to:
   compute an effective-pixel product by multiplying said first signal level output by said effective pixel by a and said predetermined coefficient,
   compute a shielded-pixel product by multiplying said first signal level output by said light-shielded pixel and said predetermined coefficient; and
   subtract said effective-pixel product from said second signal level output by said effective pixel and said shielded-pixel product from said second signal level output by said light-shielded pixel.

6. The solid-state image taking apparatus according to claim 1, wherein in a row-after-row read operation, after outputting said first signal level of said row being read, said driving section is configured to:
   drive said reset transistor to reset said second electric-charge accumulation section and drive said amplification transistor to output a reset level before outputting said second signal level; and
   said correction section is configured to subtract said first signal level and said reset level from said second signal level.

7. The solid-state image taking apparatus according to claim 1, wherein:
   said correction section is an analog-digital converter for converting an analog pixel signal output by each of said unit pixels into a digital pixel signal by using a comparator configured to compare said analog pixel signal with a reference signal having a ramp waveform, and an up/down counter configured to perform an up/down count operation synchronously with a clock signal having a fixed period and stop said up/down count operation when a signal output by said comparator is inverted to produce a count value representing said digital pixel signal; and with said first signal level supplied to said comparator, said up/down counter performs a down count operation and, with said second signal level supplied to said comparator, said up/down counter performs an up count operation to subtract said product from said second signal level.

8. The solid-state image taking apparatus according to claim 7, wherein a gradient of said ramp waveform of said reference signal is determined in accordance with said predetermined coefficient.

9. The solid-state image taking apparatus according to claim 7, wherein said predetermined coefficient is set in advance based on a ratio of an area of said first electric charge accumulation section to an area of said second electric-charge accumulation section.

10. The solid-state image taking apparatus according to claim 1, wherein each of said unit pixels includes one or more circuit elements shared by other of said unit pixels.

11. The solid-state image taking apparatus according to claim 10, wherein said unit pixels sharing said one or more circuit elements are two unit pixels provided on the same column of said matrix.

12. The solid-state image taking apparatus according to claim 11, wherein said one or more circuit elements shared by said two unit pixels include said second electric-charge accumulation section; and wherein a distance between said second electric-charge accumulation section and said first electric charge accumulation section employed in one unit pixel of said two unit pixels is equal to a distance between said second electric-charge accumulation section and said first electric-charge accumulation section employed in the other unit pixel of said two unit pixels.

13. A driving method, comprising:

in a solid-state image taking apparatus including a pixel array section including unit pixels laid out two-dimensionally to form a matrix, each of said unit pixels comprising:

an opto-electric conversion device configured to convert incident light into signal electric charge and accumulate said signal electric charge, a transfer transistor configured to transfer said signal electric charge from said opto-electric conversion device to a first electric-charge accumulation section configured to hold said signal electric charge transferred by said transfer transistor, a read transistor configured to read out said signal electric charge held in said first electric charge accumulation section and output said signal electric charge to a second electric-charge accumulation section configured to hold said signal electric charge read out by said read transistor, a reset transistor configured to reset said second electric-charge accumulation section, and an amplification transistor configured to output an electrical signal representing said signal electric charge held in said second electric-charge accumulation section:

driving said second electric-charge accumulation section from which a second aliasing signal component corresponding to first aliasing signal component generated in said first electric charge accumulation section during a period of holding said signal charge in said first electric charge accumulation section is obtained;

correcting a signal representing said signal electric charge held in said first electric-charge accumulation section based on said second aliasing signal component;

resetting said first electric-charge accumulation section and said second electric-charge accumulation section at the end of a period to accumulate said signal electric charge in said opto-electric conversion device, and, then, drive said transfer transistor to transfer said signal electric charge accumulated in said opto-electric conversion device to said first electric-charge accumulation section in a batch transfer operation;

driving said amplification transistor, in a subsequent row-after-row read operation, to output a first signal level of said second electric-charge accumulation section provided on a row included in said matrix as a row being read and, then, drive said read transistor to transfer said signal electric charge held in said first electric-charge accumulation section to said second electric charge accumulation section before again driving said amplification transistor to output a second signal level of said second electric-charge accumulation section, wherein a product of said first signal level and a coefficient set in advance is subtracted from said second signal level for correcting said signal.

* * * * *